(12) United States Patent
Rahimi et al.

(10) Patent No.: US 12,041,728 B2
(45) Date of Patent: Jul. 16, 2024

(54) SELECTIVE SOLDERING WITH PHOTONIC SOLDERING TECHNOLOGY

(71) Applicant: Apple Inc., Cupertino, CA (US)

(72) Inventors: Maryam Rahimi, Sunnyvale, CA (US);
Meng Chi Lee, Los Altos, CA (US);
Wyeman Chen, Newark, CA (US);
Leilei Zhang, Sunnyvale, CA (US);
Jason P. Marsh, Los Gatos, CA (US);
Lan Hoang, Los Gatos, CA (US);
Yashar Abdollahian, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 731 days.

(21) Appl. No.: 17/160,909

(22) Filed: Jan. 28, 2021

(65) Prior Publication Data
US 2021/0185831 A1 Jun. 17, 2021

Related U.S. Application Data

(63) Continuation-in-part of application No. 16/834,471, filed on Mar. 30, 2020, now abandoned.

(60) Provisional application No. 62/882,997, filed on Aug. 5, 2019.

(51) Int. Cl.
| | |
|---|---|
| *H05K 3/34* | (2006.01) |
| *H05K 1/11* | (2006.01) |
| *H05K 3/36* | (2006.01) |

(52) U.S. Cl.
CPC .......... *H05K 3/3457* (2013.01); *H05K 1/113* (2013.01); *H05K 3/36* (2013.01); *H05K 2203/10* (2013.01)

(58) Field of Classification Search
CPC ....... H05K 3/4038; H05K 1/114; H05K 1/115
See application file for complete search history.

(56) References Cited

U.S. PATENT DOCUMENTS

| | | | |
|---|---|---|---|
| 6,596,634 B2 | 7/2003 | Umetsu et al. | |
| 6,618,267 B1 * | 9/2003 | Dalal | H01L 23/5385 361/767 |
| 7,211,510 B2 | 5/2007 | Meadows | |
| 7,407,878 B1 | 8/2008 | Li | |
| 8,143,095 B2 | 3/2012 | Honer | |
| 9,837,480 B2 | 12/2017 | Gai et al. | |

(Continued)

FOREIGN PATENT DOCUMENTS

| | | |
|---|---|---|
| CN | 1502218 A | 6/2004 |
| CN | 1656862 A | 8/2005 |

(Continued)

OTHER PUBLICATIONS

Arutinov, et al., "Photonic Flash Soldering on Flex Foils for Flexible Electronic Systems," 2016 IEEE 66th Electronic Components and Technology Conference (ECTC), Las Vegas, NV, 2016, pp. 95-100.

(Continued)

*Primary Examiner* — David A Zarneke
(74) *Attorney, Agent, or Firm* — Aikin & Gallant, LLP

(57) ABSTRACT

Electronic assembly methods and structures are described. In an embodiment, an electronic assembly method includes bringing together an electronic component and a routing substrate, and directing a large area photonic soldering light pulse toward the electronic component to bond the electronic component to the routing substrate.

20 Claims, 19 Drawing Sheets

(56) References Cited

U.S. PATENT DOCUMENTS

| | | | |
|---|---|---|---|
| 9,837,980 B2 | 12/2017 | Tajima et al. | |
| 10,292,267 B2 * | 5/2019 | Wakabayashi | H05K 1/115 |
| 2003/0218258 A1 | 11/2003 | Charles et al. | |
| 2005/0067681 A1 | 3/2005 | De Villeneuve et al. | |
| 2005/0067688 A1 | 3/2005 | Humpston | |
| 2005/0231893 A1 | 10/2005 | Harvey | |
| 2005/0263324 A1 | 12/2005 | Wong et al. | |
| 2007/0102490 A1 | 5/2007 | Momokawa et al. | |
| 2007/0138644 A1 | 6/2007 | McWilliams et al. | |
| 2008/0206516 A1 | 8/2008 | Matsushima | |
| 2009/0315178 A1 | 12/2009 | Sakurai et al. | |
| 2011/0192826 A1 | 8/2011 | Von Moltke et al. | |
| 2011/0271523 A1 * | 11/2011 | Mantz | H05K 1/144 29/830 |
| 2012/0104066 A1 | 5/2012 | Uchiyama et al. | |
| 2015/0158268 A1 | 6/2015 | Koike et al. | |
| 2016/0240500 A1 | 8/2016 | Huang | |
| 2016/0284920 A1 | 8/2016 | Saugier et al. | |
| 2018/0013063 A1 | 1/2018 | Hamamoto et al. | |
| 2019/0027461 A1 | 1/2019 | Arutinov et al. | |
| 2021/0043597 A1 | 2/2021 | Zhang et al. | |

FOREIGN PATENT DOCUMENTS

| | | | |
|---|---|---|---|
| CN | 1792125 | A | 6/2006 |
| CN | 1864263 | A | 11/2006 |
| CN | 1894791 | B | 1/2007 |
| CN | 1960599 | A | 5/2007 |
| CN | 101252809 | A | 8/2008 |
| CN | 101601127 | A | 12/2009 |
| CN | 101979204 | A | 2/2011 |
| CN | 102217095 | A | 10/2011 |
| CN | 103258755 | A | 8/2013 |
| CN | 103764385 | B | 2/2016 |
| CN | 205645806 | U | 10/2016 |
| CN | 107690697 | A | 2/2018 |
| EP | 3276655 | A | 1/2018 |
| TW | I538005 | B | 6/2016 |

OTHER PUBLICATIONS van den Ende, et al. Large Area Photonic Flash Soldering of Thin Chips on Flex Foils for Flexible Electronic Systems: In-Situ Temperature Measurements and Thermal Modelling. Electron. Mater. Lett. vol. 10 No. 6, 2014, pp. 1175-1183.

Vivari et al., "Laser Solder Reflow: A Process Solution Part II", Year 2007, 5 pages.

* cited by examiner

SELECTIVE SOLDERING WITH PHOTONIC SOLDERING TECHNOLOGY

RELATED APPLICATIONS

This application is a continuation-in-part of co-pending U.S. patent application Ser. No. 16/834,471, filed Mar. 30, 2020, which claims priority to U.S. Provisional Application No. 62/882,997 filed Aug. 5, 2019, both of which are incorporated herein by reference.

BACKGROUND

Field

Embodiments described herein relate to microelectronic packaging techniques, and more particularly to photonic soldering.

Background Information

Microelectronic packaging has widely adopted soldering technology for bonding of electronic components. In a widely adopted conventional wide area soldering process, a bonding substrate and all components being bonded thereto are all heated above a solder reflow temperature. Such mass reflow may require that all materials can withstand the solder reflow temperature (e.g. greater than 215° C.) and dwell time, often on the order of minutes. Additional considerations with mass reflow include solder extrusion for underfilled electronic components. Selective soldering techniques such as laser soldering and hot air soldering have been adopted in some applications to avoid high temperature exposure, for example to the electronic component being bonded, the substrate, or adjacent components.

More recently large area photonic soldering has been proposed as a method for soldering chips to a low temperature substrate. In such a method a high-power flash lamp (e.g. xenon) is pulsed to emit a high intensity flash pulse that is selectively absorbed by the chips being bonded rather than the bonding substrate.

SUMMARY

Electronic assembly methods and structures are described. In an embodiment, an electronic assembly method includes bringing together an electronic component and a routing substrate, and directing a large area photonic soldering light pulse toward the electronic component to bond the electronic component to the routing substrate. A variety of structures are described that may shield a sensitive electronic component from exposure to the light pulse. The disclosed assembly methods may additionally be applied to joining of routing substrates.

BRIEF DESCRIPTION OF THE DRAWINGS

FIGS. 14B-14D are close-up cross-section side view illustration of a solder material location prior to reflow in accordance with embodiments.

DETAILED DESCRIPTION

Figure 1:
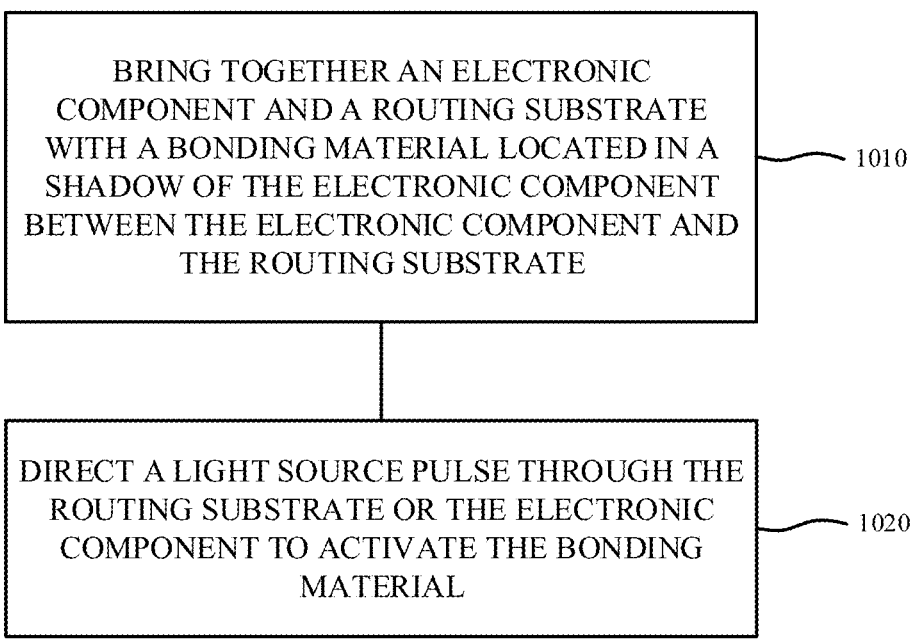
FIG. 1 is a flow chart of an electronic assembly method including selective photonic soldering in accordance with an embodiment.

Embodiments describe selective soldering techniques with photonic soldering, and associated structures. The selective soldering processes may restrict photonic light transmission to select areas, and leverage different light energy absorption rates of different materials.

It has been observed that traditional selective soldering techniques such as laser soldering and hot air soldering have associated challenges in implementation. For example, it can be difficult to control molten solder temperature with laser soldering, which can also damage components. Additionally, laser soldering is pad by pad, and has a low throughput of units per hour (UPH). Hot air soldering additionally has the associated issues of air control, and low UPH.

The selective soldering methods and structures in accordance with embodiments may allow use of low temperature materials, such as polyethylene terephthalate (PET) flex substrates, with high temperature solder, and minimize heat impact on adjacent components. The selective soldering methods and structures in may also allow for large area (e.g. wafer or panel level) selective soldering with short time (on the order of seconds). Furthermore, the selective soldering methods and structures described herein can be implemented with a variety of electrically conductive bonding materials that are heat activated including namely solder materials, as well as sintering pastes (e.g. silver paste, copper paste), a snap cure material, conductive epoxy, etc. Furthermore, the selective soldering methods and structures may allow for the use of bonding materials with high activation temperatures (such as a high temperature solder with a liquidus temperature above 217° C.) in combination with sensitive electronic components or routing substrates that need to be maintained below the high activation temperature (e.g. solder reflow, sintering, cure).

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 3:
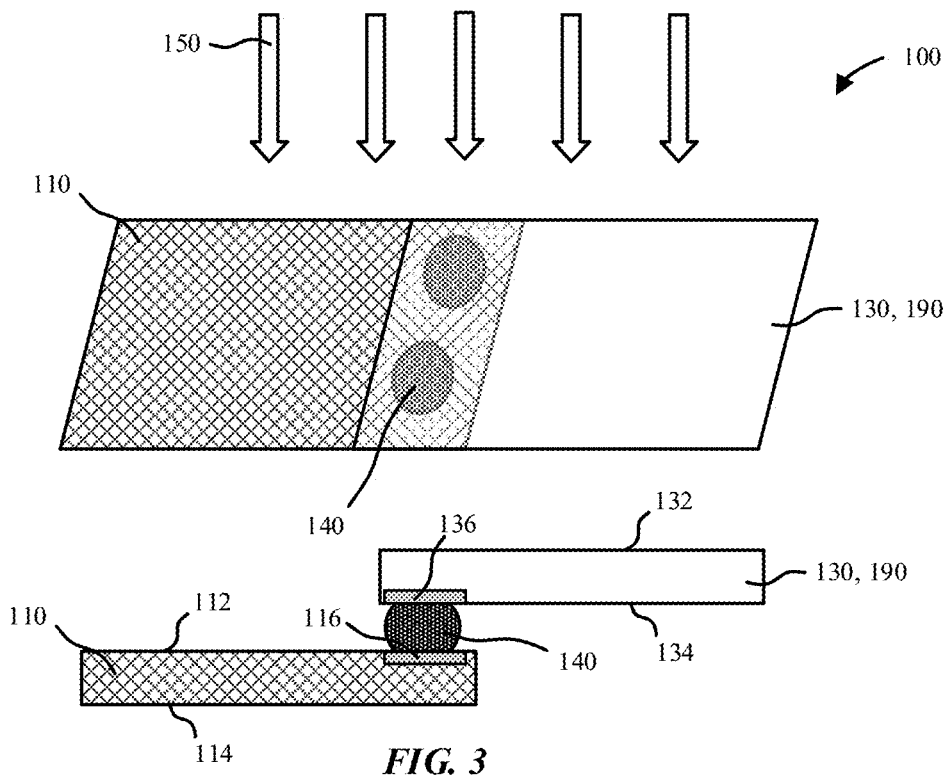
FIG. 3 is a cross-sectional side view illustration of selective photonic soldering of a transparent routing substrate to an opaque routing substrate in accordance with an embodiment.
Figure 4:
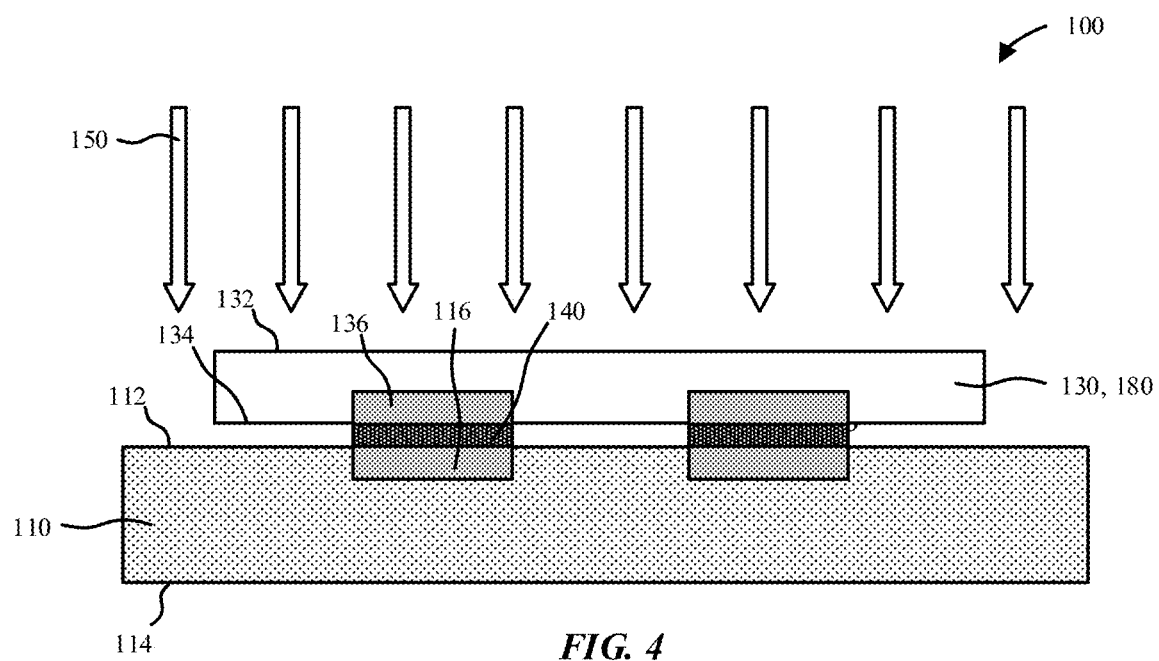
FIG. 4 is a cross-sectional side view illustration of selective photonic soldering of a transparent electronic component to a routing substrate in accordance with an embodiment.

Referring now to FIG. 1 a flow chart is provided of an electronic assembly method including selective photonic soldering in accordance with an embodiment. In interest of conciseness and clarity, the sequence of FIG. 1 is discussed concurrently with the cross-sectional side view illustrations of FIGS. 2-4. Specifically, FIG. 2 illustrates selective photonic soldering of an electronic component 130 such as a device 180 to a transparent routing substrate 110, FIG. 3 illustrates selective photonic soldering of an electronic component 130 such as a transparent routing substrate 190 to an opaque routing substrate 110, and FIG. 4 illustrates selective photonic soldering of a transparent electronic component 130 such as device 180 to a routing substrate 110 in accordance with embodiments.

The electronic components 130 in accordance with all embodiments described herein may be a variety of devices 180 including chips, packages, diodes, sensors, including both active and passive devices, and routing substrates 190 such as rigid or flexible routing substrates. Essentially, embodiments may be applicable to any pad-to-pad connection. Referring briefly to the embodiment illustrated in FIG. 9, such a selective soldering technique is utilized to join a lid 900 to a routing substrate 110 where the lid 900 also functions to block light transmission to the electronic component 130 that the lid covers.

Referring again to FIG. 1, in an embodiment an electronic assembly method includes bringing together an electronic component 130 and a routing substrate 110 with a heat activated bonding material 140 located in a shadow of the electronic component between the electronic component 130 and the routing substrate 110 at operation 1010. Exemplary heat activated bonding materials 140 in accordance with embodiments described herein include solder materials (e.g. solder bumps), as well as sintering pastes (e.g. silver paste, copper paste), a snap cure material, conductive epoxy, etc. As described herein, in an exemplary top view illustration the shadow is represented by the are defined by the outline (perimeter) of the electronic component 130 overlapping the routing substrate 110. Thus, the area directly between the electronic component 130 and routing substrate 110 would be within the shadow of the electronic component 130. At operation 1020, a light pulse 150 is directed from a light source and transmitted through the routing substrate 110 or the electronic component 130 to activate (e.g. reflow, sinter, cure) the bonding material 140.

Figure 2:
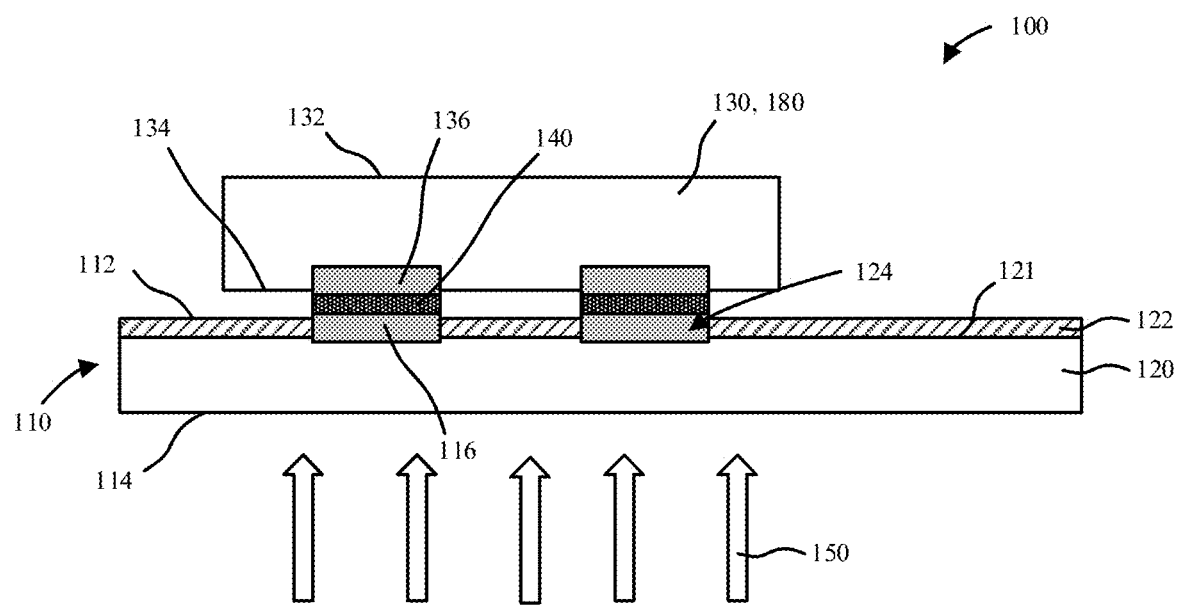
FIG. 2 is a cross-sectional side view illustration of selective photonic soldering of an electronic component to a transparent routing substrate in accordance with an embodiment.

In the embodiment illustrated in FIG. 2, the light pulse 150 is transmitted through a bottom side 114 of the routing substrate 110 and toward the bonding material 140 to activate the bonding material. As shown, the routing substrate 110 includes a top side 112 and bottom side 114. The electronic component 130 includes a top side 132 and bottom side 134. The routing substrate 110 may further include a transparent layer 120, a plurality of metal landing pads 116 on a top side 121 of the transparent layer 120. Additional routing layers may be including on the top side 121 of the transparent layer 120 or within the transparent layer 120. The bonding material 140 is a plurality of high temperature solder bumps in an embodiment. The routing substrate 110 may additionally include a coverlay film 122 on the top side 121 of the transparent layer 120, and a plurality of openings 124 in the coverlay film 122 exposing the plurality of metal landing pads 116 on the top side 121 of the transparent layer 120. The coverlay film 122 may be formed of a suitable insulating material such as polymer or oxide. For example, the coverlay film 122 may be a solder-mask material, such as epoxy.

The electronic assembly methods in accordance with embodiments may utilize large area, yet localized photonic soldering techniques to allow for high temperature soldering (e.g. solder materials with a liquidus temperature above 217° C.) of sensitive electronic components (e.g. components that need to be maintained below the high temperature solder reflow temperature). Thus, the particular configurations may isolate the electronic components from the heat. Still referring to FIG. 2, the coverlay film 122 may be designed to substantially block transmission of the light pulse 150 toward the electronic component 130 by absorption or reflection. Thus, the light pulse is substantially absorbed or reflected in the shadow of the electronic component 130. However, the light pulse that is transmitted to the landing pads 116 is absorbed by the landing pads, and being a thermally conductive metallic material heat is transferred to the bonding material 140 to join the landing pads 116 of the routing substrate 110 to the metal contact pads 136 of the electronic component 130.

As used herein, the phrases "substantially block," "substantially absorb," "substantially reflect" or be "substantially transparent" to transmission of the photonic soldering light pulse are used in a general sense to characterize some non-bonding layer materials considering the photonic soldering techniques employed. For example, a feature that substantially blocks transmission of the photonic soldering light pulse, may block greater than 90% of the photonic soldering light pulse by absorption or reflection. A feature that is substantially transparent may transmit greater than 90% of the photonic soldering light pulse. In some embodiments, the photonic soldering light pulse may be in the ultraviolet-infra red (UV-IR) spectrum, though embodiments are not necessarily limited to this range and can vary based on absorption rate of selected materials. Blocking of the photonic soldering light pulse 150 transmission may be substantial enough so that the electronic component is not heated to same temperature required for activation (e.g. reflow, sintering, cure) of the bonding material 140. In some embodiments, the bonding material 140 (e.g. black solder paste, black solder ball) may additionally be designed for absorption photonic soldering light pulse 150.

In accordance with some embodiments a coverlay film 122 serves as a light mask to substantially block the light pulse. In an embodiment, the coverlay film 122 is characterized as a light absorbing or opaque material to substantially block/absorb transmission (e.g. greater than 90%) of the light pulse. For example, the light absorbing material can be a dark color, such as black. Furthermore, the coverlay film 122 may be an insulating material with low thermal conductivity, so that heat is not transferred as efficiently as with the metal landing pads. The light absorbing material may be further characterized as having no or low (e.g. less than 10%) light reflectance. Conversely, the coverlay film 122 may be characterized as a reflective material to substantially block/reflect (e.g. greater than 90%) of the light pulse. For example, the light pulse may be reflected back toward and through the transparent layer (e.g. substrate) 120. Reflection may be substantial enough so that the electronic component is not heated to same temperature required for activation of the bonding material 140. In an embodiment, the reflective material is a light color, such as white.

In an embodiment, an electronic assembly 100 includes an electronic component 130, a routing substrate 110 including a top side 112 and a bottom side 114, where the top side 112 of the routing substrate 110 includes a plurality of metal landing pads 116. A bonding material 140 is located in a shadow of the electronic component 130 between the electronic component and the routing substrate 110. In various embodiments, either the electronic component 130 or the transparent layer 120 is substantially transparent to a photonic soldering light pulse 150. The routing substrate may include a coverlay film 122 and a plurality of openings 124 in the coverlay film exposing the plurality of metal landing pads 116. The coverlay film 122 may cover an entirety of the shadow of the electronic component 130 between the electronic component and the routing substrate 110, less the plurality of openings 124 exposing the plurality of metal landing pads 116. This may facilitate substantially blocking the photonic soldering light pulse 150 wavelength, which may additionally be facilitated by materials selection and doping/color of the coverlay film 122. In an embodiment, the coverlay film 122 (e.g. black film) substantially blocks/absorbs a photonic soldering light pulse. In an embodiment, the coverlay film 122 (e.g. white film) substantially blocks/reflects a photonic soldering light pulse.

Referring now to FIG. 3, in the embodiment illustrated the light pulse 150 may be directed through a top side 132 of the electronic component 130 and toward the bonding material 140 to activate (e.g. reflow, sinter, cure) the bonding material. In such an embodiment, the body of the electronic component 130 is substantially transparent to the light pulse. In this response, substantially transparent allows sufficient transfer of the light pulse 150 through the body of electronic component 130 to activate (e.g. reflow, sinter, cure) the bonding material 140. As shown, the electronic component 130 may include a metal contact pad 136 which will selectively absorb the light pulse 150, and transfer heat to the bonding material 140 for activation (e.g. reflow, sinter, cure). In the particular embodiment illustrated, the electronic component 130 is a transparent routing substrate 190. Thus, the illustrated embodiment joints two routing substrates, which may be rigid or flexible. In an embodiment, the electronic component 130 of the electronic assembly 100 is a second routing substrate 190 that is substantially transparent to the photonic soldering light pulse.

FIG. 4 illustrates an embodiment including a transparent device 180 as the electronic component 130. In an exemplary implementation the device 180 is formed of a silicon body, which may be thin enough (e.g. less than 200 μm) to be substantially transparent to the light pulse 150. In an embodiment, the electronic component 130 of the electronic assembly 100 is a silicon device less than 200 μm thick, which is transparent to the photonic soldering light pulse.

Figure 5:
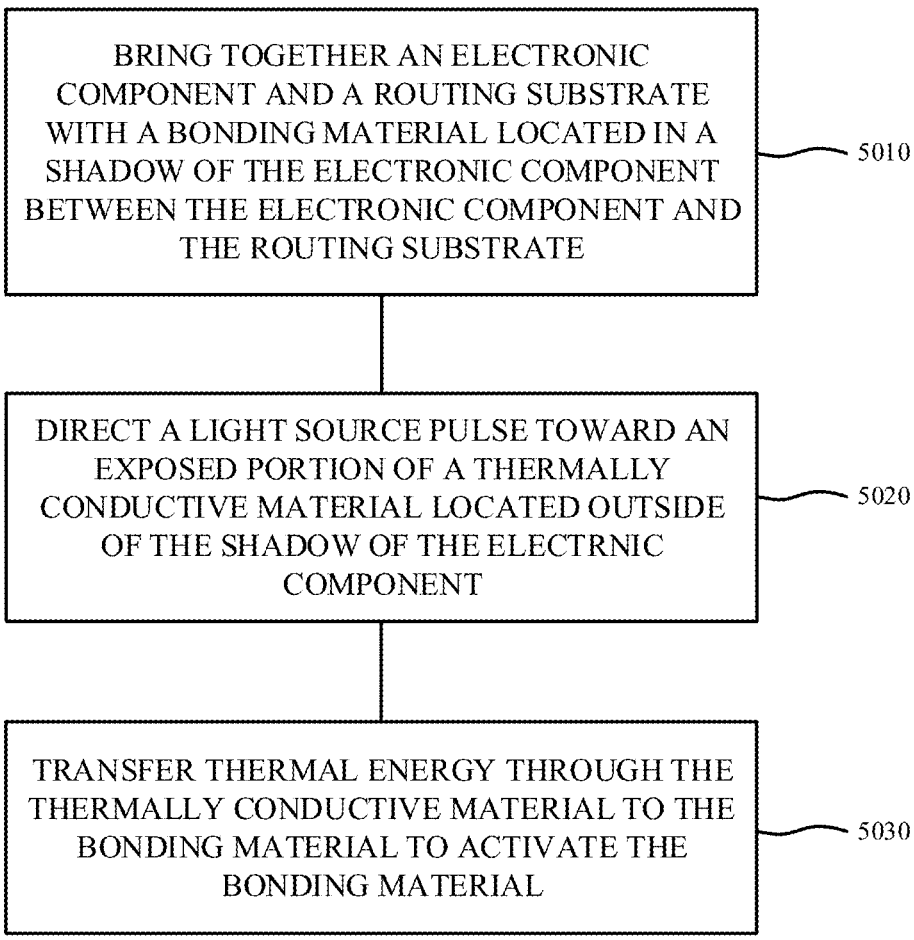
FIG. 5 is a flow chart of an electronic assembly method including selective photonic soldering in accordance with an embodiment.

Referring now to FIG. 5 a flow chart is provided of an electronic assembly method including selective photonic soldering with aid of an exposed portion of a thermally conductive material in accordance with an embodiment. In interest of conciseness and clarity, the sequence of FIG. 5 is discussed concurrently with the cross-sectional side view illustrations of FIGS. 6A-12C. In an embodiment an electronic assembly method includes bringing together an electronic component 130 and a routing substrate 110 at operation 5010, and directing a light pulse 150 from a light source toward a portion of a thermally conductive material located outside of a shadow of the electronic component 130 between the electronic component and the routing substrate 110 at operation 5020. The thermally conductive material may be a variety of structures in accordance with embodiments, such as metal wiring layer of the routing substrate (including routing layers and/or metal landing pads), metal wiring layer attached to the routing substrate, a wire for wire bonding, lid, etc. At operation 5030 thermal energy is transferred through the thermally conductive material to the bonding material to activate the bonding material, which forms an electrically conductive solder joint between the electronic component 130 and the routing substrate 110.

Figure 6A:
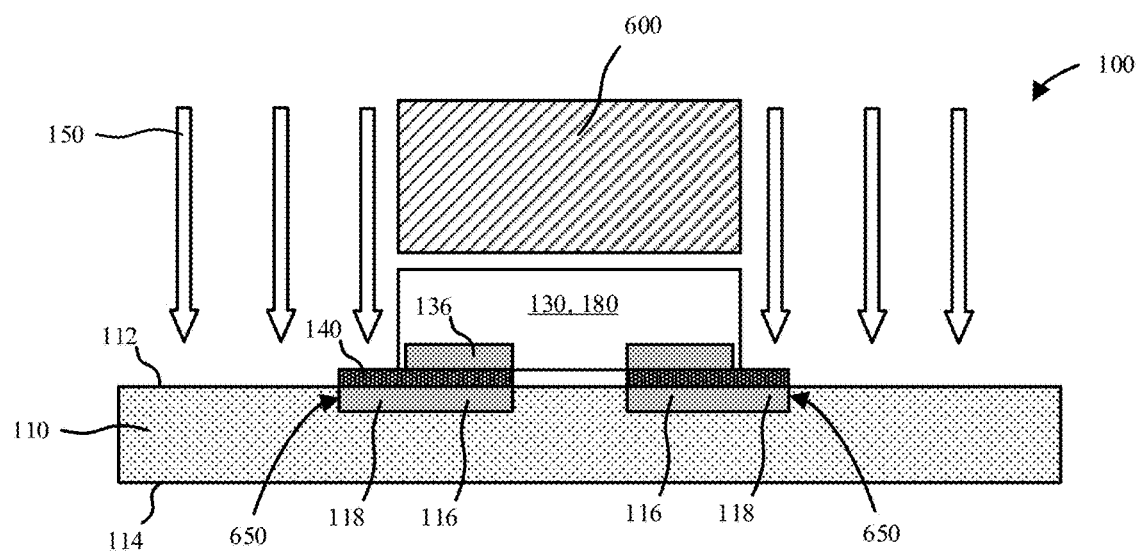
FIGS. 6A-6B are cross-sectional side view illustrations of selective photonic soldering of an electronic component to a routing substrate with a metal wiring layer outside the shadow of the electronic component in accordance with embodiments.
Figure 6B:
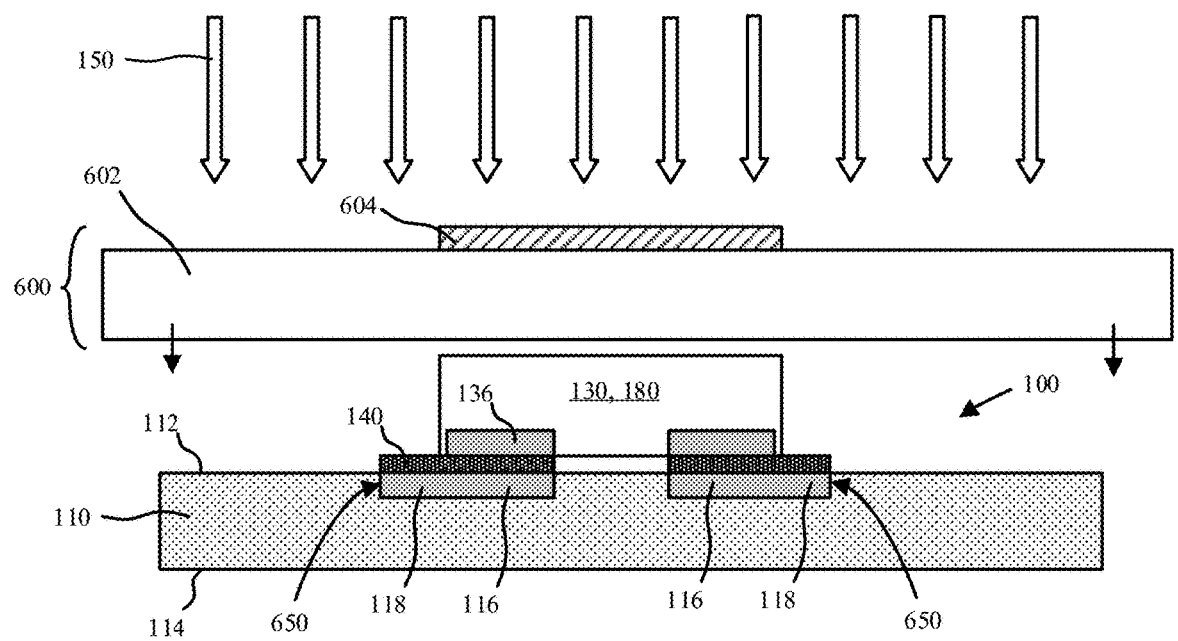

FIG. 6A is a cross-sectional side view illustration of selective photonic soldering of an electronic component 130 to a routing substrate 110 with a metal wiring layer 650 outside the shadow of the electronic component in accordance with an embodiment. The metal wiring layer 650 may be part of the routing substrate 110. For example, the metal wiring layer 650 may include a portion 118 that spans outside of the shadow of the electronic component, and portion (e.g. metal landing pad 116) that spans within the shadow of the electronic component. Portion 118 may be part of a metal routing, or extension of the metal landing pad 116. Similarly, the bonding material 140 may be located in the shadow of the electronic component, and may optionally span outside of the shadow of the electronic component on the portion 118 of the metal wiring layer 650. Where bonding material 140 additionally spans outside of the shadow a pigment may optionally be added into the bonding material 140 to facilitate light absorption by the boding material 140 in addition to the metal wiring layer 650. In order to protect a sensitive electronic component 130 from the light pulse 150, a light mask 600 can be placed over the electronic component 130 when directing the light pulse 150 from the light source toward the exposed portion of the thermally conductive material located outside of the shadow of the electronic component 130. In such an embodiment, the light mask 600 can be formed of a material to absorb the light pulse, and include openings to pass the light pulse. Referring now to FIG. 6B an alternative version of a light mask is illustrated in which the light mask 600 includes a bulk layer 602 that is at least substantially transparent to the light pulse 150, and a patterned filter layer 604. The patterned filter layer 604 may reflect the light pulse 150 and/or absorb the light pulse 150 in order to filter transmission. In an embodiment the bulk layer is formed of glass (e.g. quartz), or a transparent polymer. In an embodiment, the patterned filter layer 604 includes one or more metal layers that can be deposited using various suitable thin film deposition techniques. This can additionally take advantage of the reflectivity of the metallized coating (e.g. aluminum, gold, silver) in conjunction with un ultraviolet filter already integrated into a light source housing assembly to effectively block any incoming light to be filtered. In the illustrated embodiment, the light mask 600 can be pressed on top of the electronic component 130 to ensure sufficient force is present for photonic soldering to the routing substrate 110. The light mask 600 may also selectively heat the electronic component and routing substrate using the (metallized) patterned filter layer 604. Such light masks 600 as described and illustrated with regard to FIGS. 6A-6B may additionally be used in other embodiments described herein, although not specifically illustrated.

Figure 7:
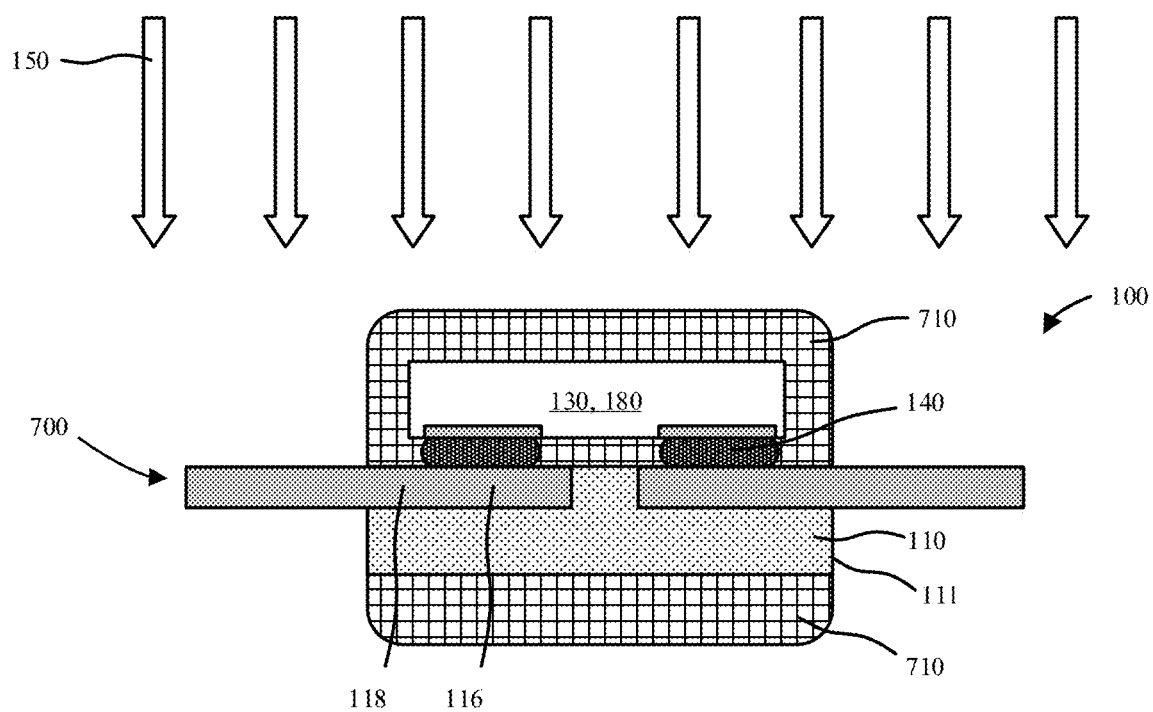
FIG. 7 is a cross-sectional side view illustration of selective photonic soldering of an electronic component to a routing substrate with an external wire in accordance with an embodiment.

FIG. 7 is a cross-sectional side view illustration of selective photonic soldering of an electronic component to a routing substrate with an external wire in accordance with an embodiment. In the embodiment illustrated in FIG. 7, the wiring layer 700 may be similar to wiring layer 650, with one difference being the wiring layer 700 extends beyond an outside perimeter 111 of the routing substrate 110. In an embodiment, wiring layer 700 is a separate structure bonded to the routing substrate 110. In one implementation, the electronic assembly 100 of FIG. 7 is a wearable structure, where the electronic component 130 and routing substrate 110 are embedded in a textile (e.g. fabric), with leads of the wiring layer 700 extending therefrom. In this configuration, the exposed leads that are either outside the shadow of the electronic component 130, or extend outside of the textile 710 absorb the light pulse 150 from the light source and transfer the heat to the bonding material 140. Similar to FIGS. 6A-6B, a light mask 600 can optionally be used.

Figure 8A:
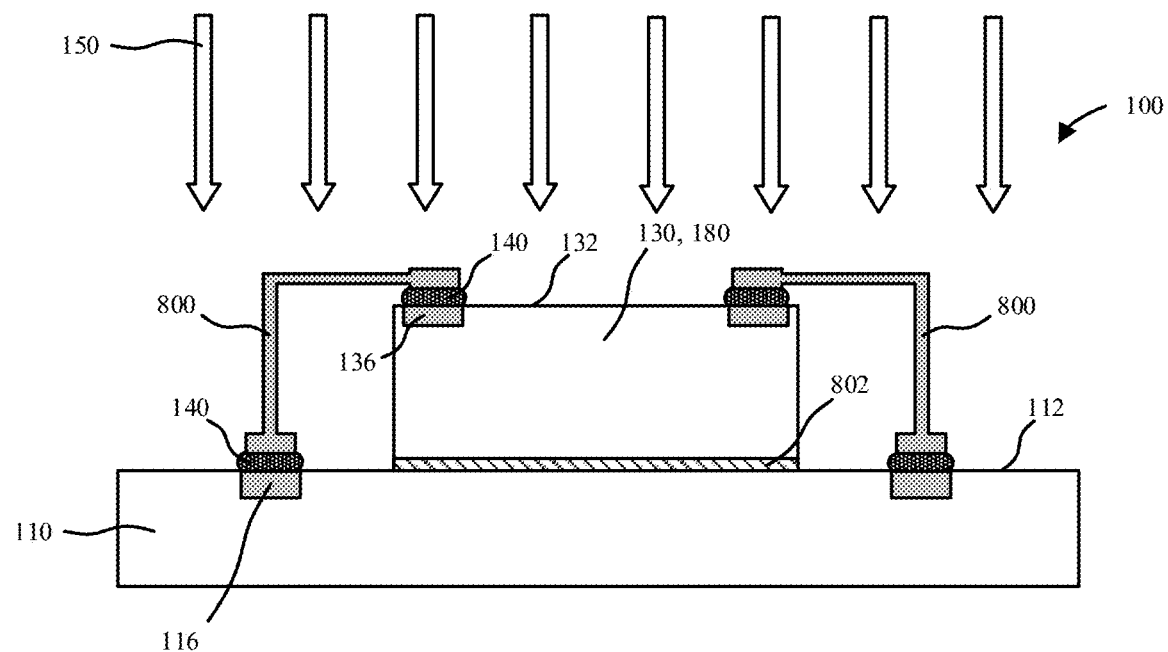
FIG. 8A is a cross-sectional side view illustration of selective photonic soldering of an exposed metal wire in accordance with an embodiment.

FIG. 8A is a cross-sectional side view illustration of selective photonic soldering of an exposed metal wire 800 in accordance with an embodiment. In the particular embodiment illustrated, the electronic component 130 is attached face up to the routing substrate 110 using an adhesive layer 802. The bonding material 140 is used for wire bond attachment. For example, the bonding material 140 can include a first solder bump and a second solder bump, and the metal wire is bonded to the top side 132 of the electronic component 130 with the first solder bump, and a top side 112 of the routing substrate 110 with the second solder bump. Alternatively, other bonding materials may be used in lieu of solder bumps. In such a configuration, the wire 800 is directly exposed to the light pulse, and transfers heat to the bonding material 140.

Figure 8B:
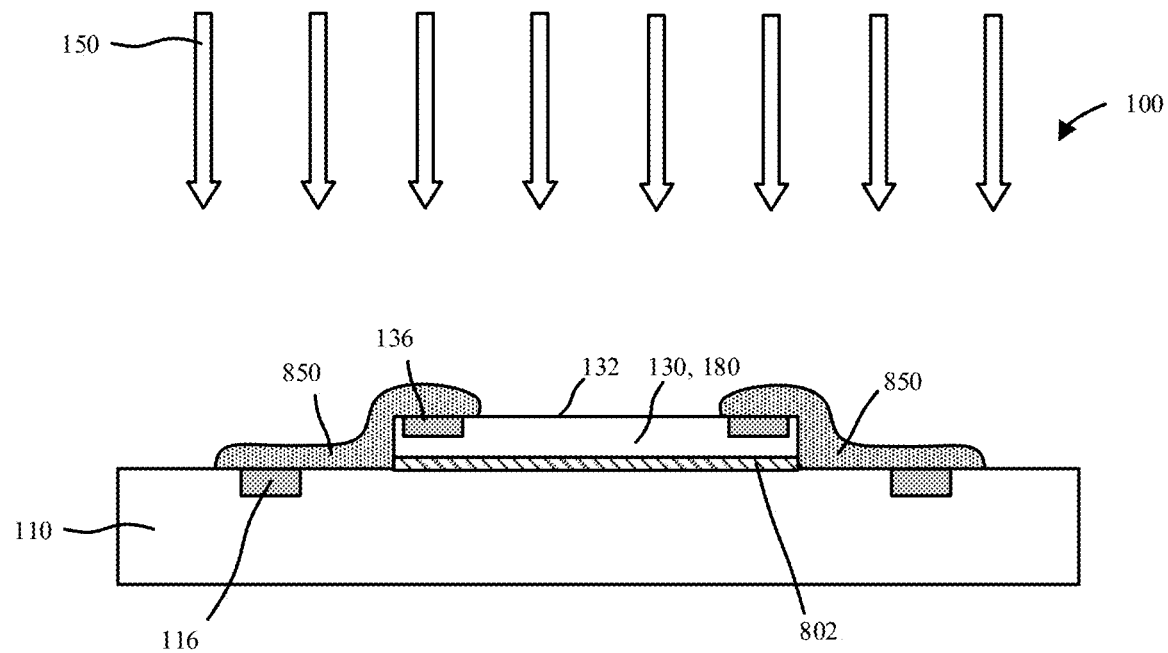
FIG. 8B is a cross-sectional side view illustration of selective photonic soldering of a printed interconnect in accordance with an embodiment.

Referring now to FIG. 8B, a cross-sectional side view illustration is provided of selective photonic soldering of a printed interconnect 850 in accordance with an embodiment. For example, a printed interconnect 850 may be printed (e.g. ink jet, screen print, etc.) onto a thin device 180, such as less than 30 microns thick, and routing substrate 110. A light pulse 150 is then directed toward the printed interconnect 850 to activate the printed interconnect (e.g. simultaneously flow, cure) to form the electrical joint between the landing pads 116 and contact pads 136. The structure and process of FIG. 8B may or may not include a separate bonding material for formation.

Figure 9:
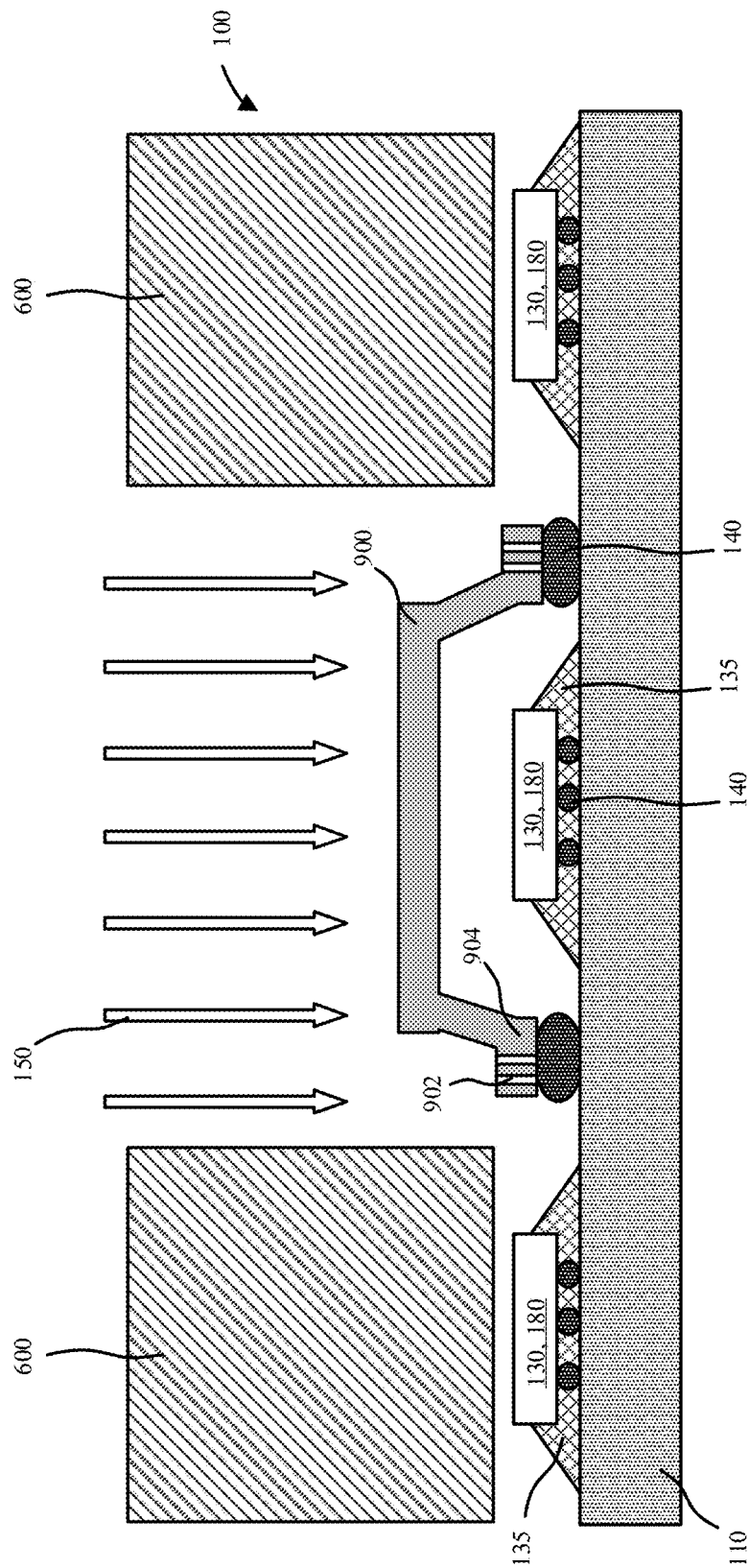
FIG. 9 is a cross-sectional side view illustration of selective photonic soldering of a lid to a routing substrate in accordance with an embodiment.

Thus far a variety of thermally conductive materials (e.g. wiring layers, wires) have been described for transferring heat to activate a bonding layer for bonding an electronic component 130 to a routing substrate 110. In addition, FIG. 8B has described using such a photonic soldering technique to flow, cure a printed interconnect 850, which directly absorbs the light energy. Referring now to FIG. 9, a cross-sectional side view illustration is provided of selective photonic soldering of a lid 900 to a routing substrate 110 in accordance with an embodiment. In such an embodiment, the thermally conductive material is a lid 900, and bonding material 140 is located between the lid and the routing substrate 110 and directly physically connects the lid to the routing substrate. Furthermore, the lid 900 may shield an underlying sensitive electronic component 130 from the light pulse 150. Similar to other embodiments, a light mask 600 may be used to shield adjacent electronic components 130. In the embodiment illustrated in FIG. 9 the lid 900 is selectively heated, and the heat is transferred to the bonding material 140 to complete the lid 900 attachment. Furthermore, the lid 900 can protect the underlying electronic component 130 from shorting, particularly if there happens to be a void in the underfill material 135. In an embodiment, slots 902 can be formed in locations of the base or feet of the lid 900 which will be placed directly over the bonding material 140 in order allow direct absorption of the light pulse 150 by the bonding material 140.

Figure 10A:
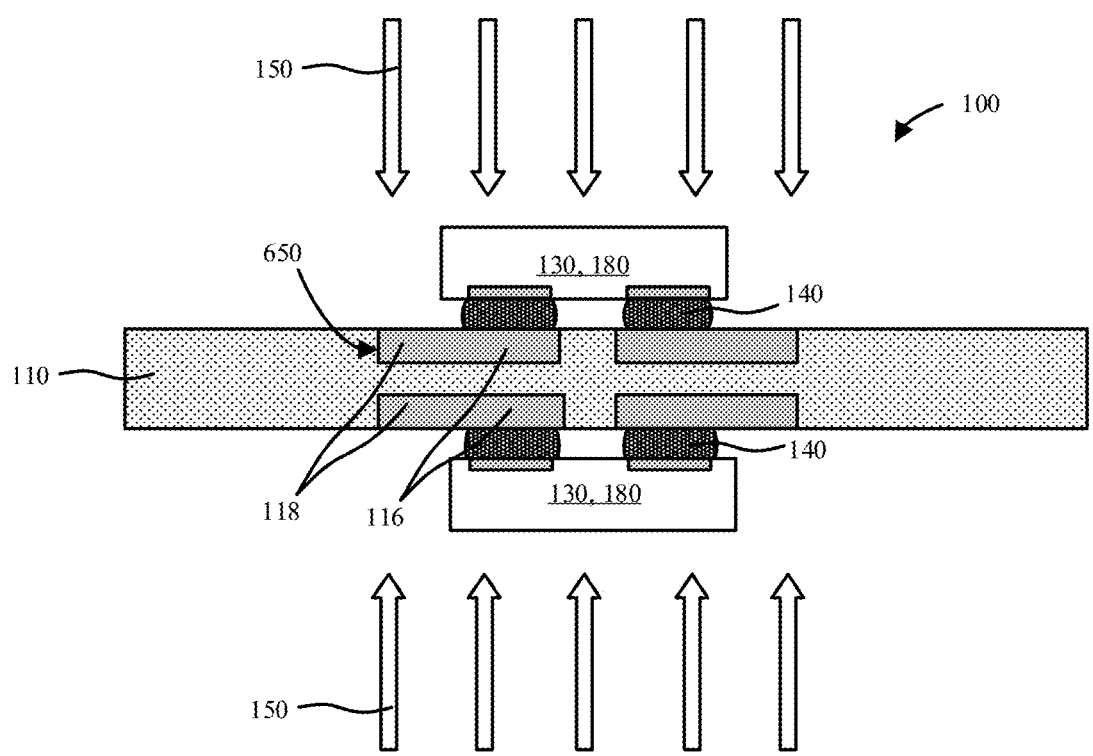
FIG. 10A is a cross-sectional side view illustration of double sided selective photonic soldering of electronic components to a routing substrate in accordance with an embodiment.

Each of the embodiments described and illustrated thus far have also illustrated a photonic soldering technique of a single electronic component or lid, on a single side of the routing substrate 110. However, embodiments are not so limited and may be applicable to double sided integration, and stacking of components. FIG. 10A is a cross-sectional side view illustration of double sided selective photonic soldering of electronic components 130 to a routing substrate 110 with a backside conductive material in accordance with an embodiment. While FIG. 10A is substantially similar to that of FIGS. 6A-6B, this is exemplary, and double sided selective photonic soldering may be applied to the other illustrated configurations as well. Furthermore, the selective photonic soldering techniques may cover a large area, and multiple electronic components and routing substrates.

Each of the embodiments illustrated and described with regard to FIGS. 6A-10A have shared a common feature of selective photonic soldering with aid of an exposed portion of a thermally conductive material. The light pulses 150 have generally been directed towards top sides of the electronic components 130 and routing substrates 110, where the exposed portions of the thermally conductive material have been outside of the shadow between the electronic components 130 and routing substrates 110, or even on top of the electronic components 130.

Figure 10B:
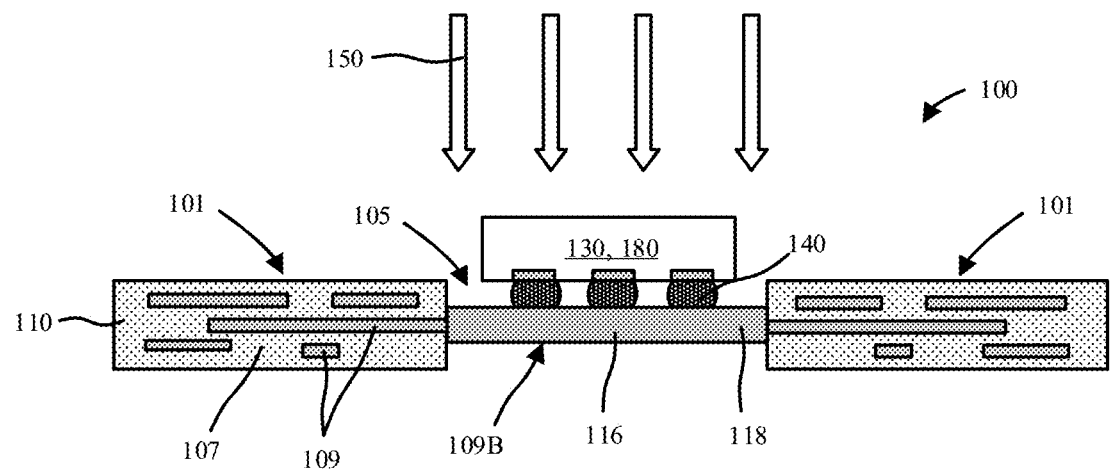
FIGS. 10B-10C are cross-sectional side view illustrations of selective photonic soldering of an electronic component onto a metal wiring layer bridge in accordance with embodiments.
Figure 10C:
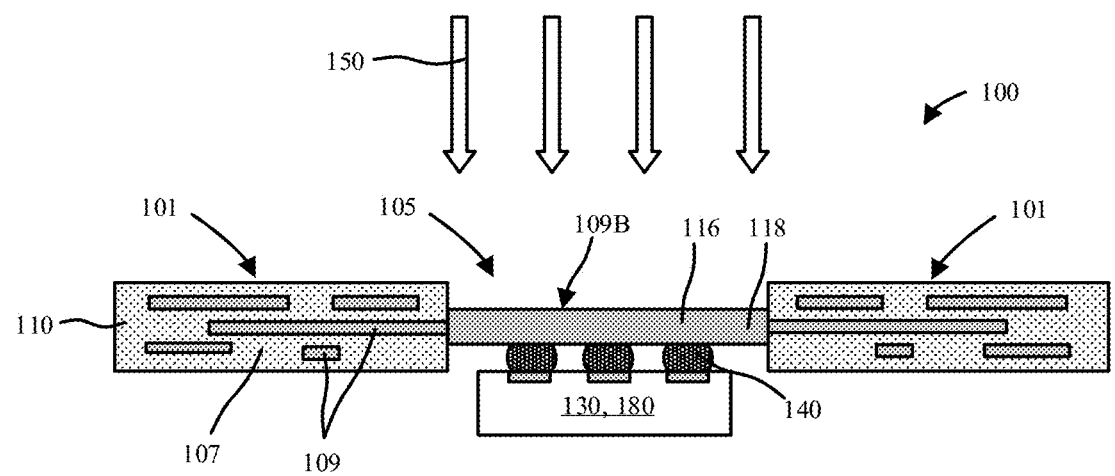
Figure 10D:
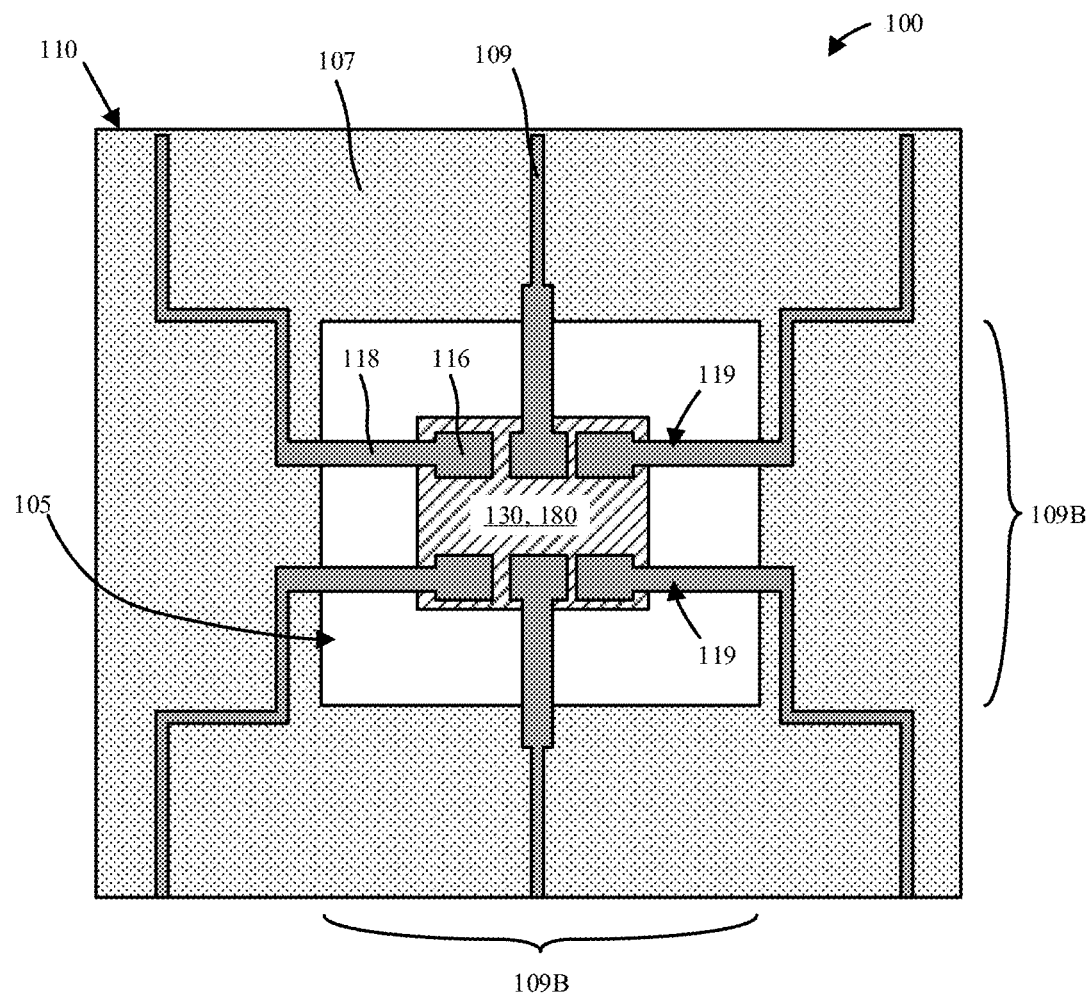
FIG. 10D is a schematic top-down illustration of an electronic component on a metal wiring layer bridge in accordance with an embodiment.

Referring now to FIGS. 10B-10C cross-sectional side view illustrations are provided for an electronic assembly 100 formed by selective photonic soldering of an electronic component 130 onto a metal wiring layer bridge 109B in accordance with embodiments. FIG. 10D is a schematic top-down illustration of the electronic assemblies of FIGS. 10B-10C in accordance with an embodiment. As show, the electronic assembly 100 may include a routing substrate 110 including one or more dielectric layers 107 and conductive routing layers 109. The routing substrate 110 includes an opening 105 in a bulk area 101 (e.g. through the dielectric layers 107). A metal wiring layer bridge 109B extends from the bulk area 101 and into the opening 105, and includes a plurality of landing pads 116 onto which a component 130 is bonded.

Similar to the metal wiring layers 650, 700, the metal wiring layer bridge 109B may include a portion 118 that spans outside the shadow of the electronic component 130, and a portion (e.g. metal landing pads 116) that span within the shadow of the electronic component. Similarly, the bonding materials 140 may be located in the shadow of the electronic component 130. Portion 118 spanning outside of the shadow of the electronic component 130 may be useful when directing the light pulse 150 from above the electronic component and a top side off the routing substrate 110 as shown in FIG. 10B. Alternatively, or additionally, the light pulse 150 can be directed form a back side of the routing substrate 110 opposite the electronic component to transfer head through the metal wiring layer bridge 109B.

Referring to FIG. 10D the metal wiring layer bridge 109B may include a plurality of metal wiring arms 119 extending from the bulk area 101 and into the opening 105 For example, each arm 119 can include a landing pad 116, and a portion 118 which may optionally extend outside the shadow of the component 130, 180. The particular cut-out configuration of FIGS. 10B-10D in which the electronic component 130 is bonded to a metal wiring layer bridge 109B may allow for a photonic soldering technique that incorporates a sensitive, low temperature routing substrate 110 materials (e.g. dielectric layers 107 such as PET) and can also allow for use of high temperature solder (e.g. characterized by a liquidus temperature above 217° C.). Furthermore, where electronic component 130 may be sensitive to the light pulse, area of the wiring layer bridge 109B (including landing pads 116, and any dummy structure) may be increased to block light transmission.

In an embodiment, an electronic assembly method includes bringing together an electronic component 130 and a routing substrate 110, directing a light pulse 150 from a light source toward a portion of a thermally conductive material (e.g. wiring layer bridge 109B) located outside a shadow of the electronic component and the routing substrate 110. For example, this may be a portion 118 of the wiring layer bridge 109B laterally adjacent to the shadow, or toward a back side of the wiring layer bridge 109B. Thermal energy is then transferred through the thermally conductive material (wiring layer bridge 109B) to a bonding material 140 to activate the bonding material and bond the electronic component 130 to the routing substrate 110, or more specifically to landing pads 116 of the wiring layer bridge 109B. Similar to the description of FIGS. 6A-6B, a light mask 600 can be located over the electronic component 130 when directing the light pulse 150 toward the wiring layer bridge 109B.

Figure 11:
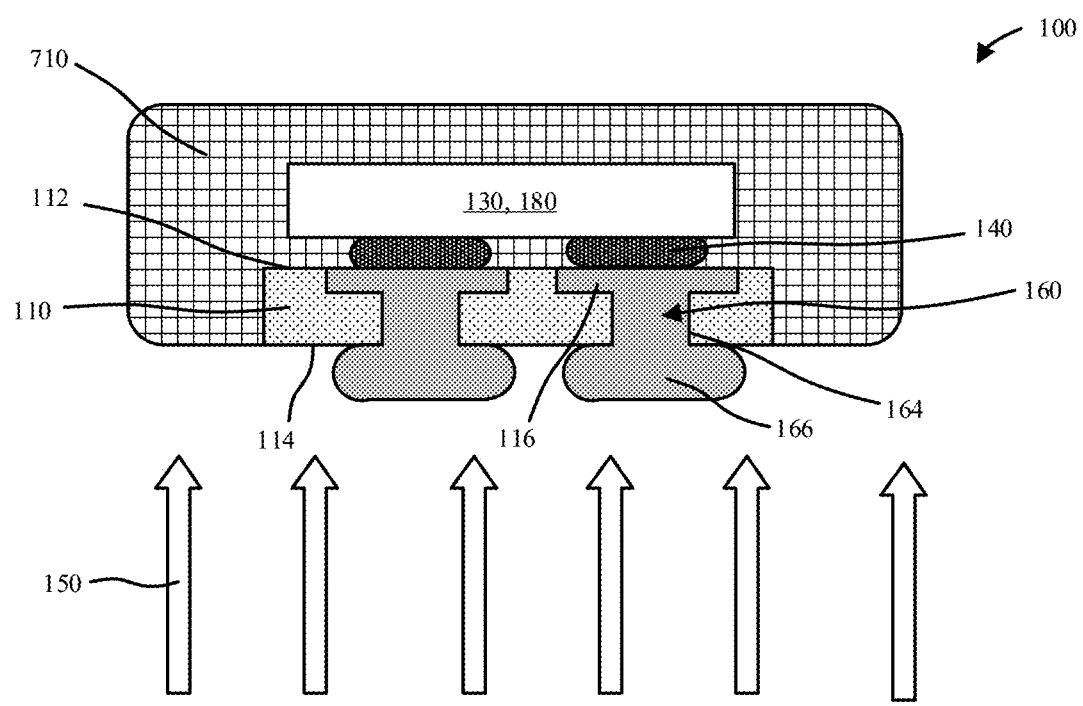
FIG. 11 is a cross-sectional side view illustration of selective photonic soldering of an electronic component to a routing substrate with a backside conductive material in accordance with an embodiment.

FIG. 11 is a cross-sectional side view illustration of selective photonic soldering of an electronic component 130 to a routing substrate 110 with a backside conductive material in accordance with an embodiment. Specifically, the thermally conductive material includes a via opening 160 with sidewalls 164 extending through the routing substrate 110, and the light pulse 150 is directed toward a bottom side 114 of the routing substrate 110, and the bonding material 140 is located on a top side 112 of the routing substrate 110 and physically connects the electronic component to the top side of the routing substrate. In an embodiment, the conductive material includes a landing pad 116, via opening 160, and bottom contact area 166. The bottom contact area 166 may additionally be sized to absorb the light pulse 150, or partially block transmission of the light pulse through the routing substrate 110. Routing substrate 110 may additionally be opaque to the light pulse 150 to prevent transmission of the light pulse 150 to a sensitive electronic component 130. Such a thermally conductive material, including the via opening 160 and bottom contact area 166 may optionally be integrated in the structure of FIG. 2 to facilitate heat conduction.

Figure 12A:
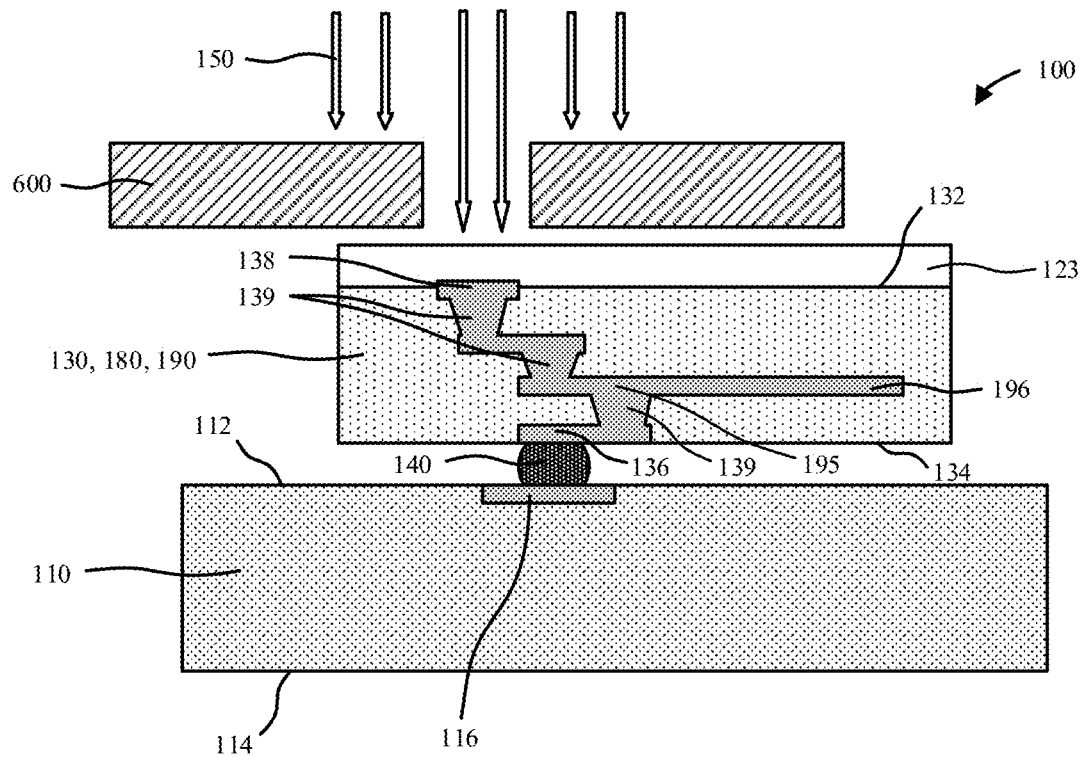
FIG. 12A is a cross-sectional side view illustration of selective photonic soldering of an electronic component to a routing substrate by transferring heat through circuitry in the electronic component in accordance with an embodiment.
Figure 12B:
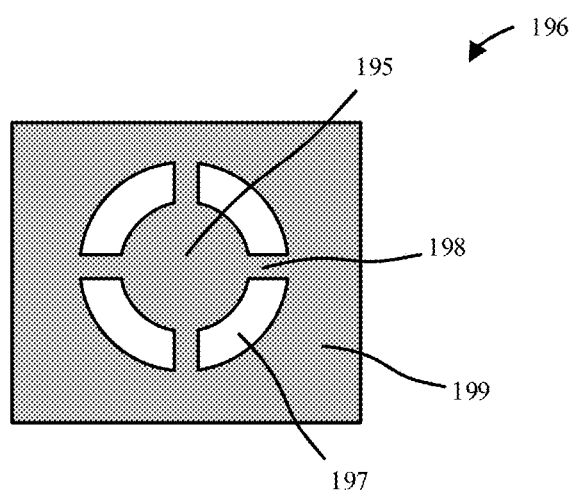
FIG. 12B is a top view illustration of a pad coupled with a conductive plane in accordance with an embodiment.
Figure 12C:
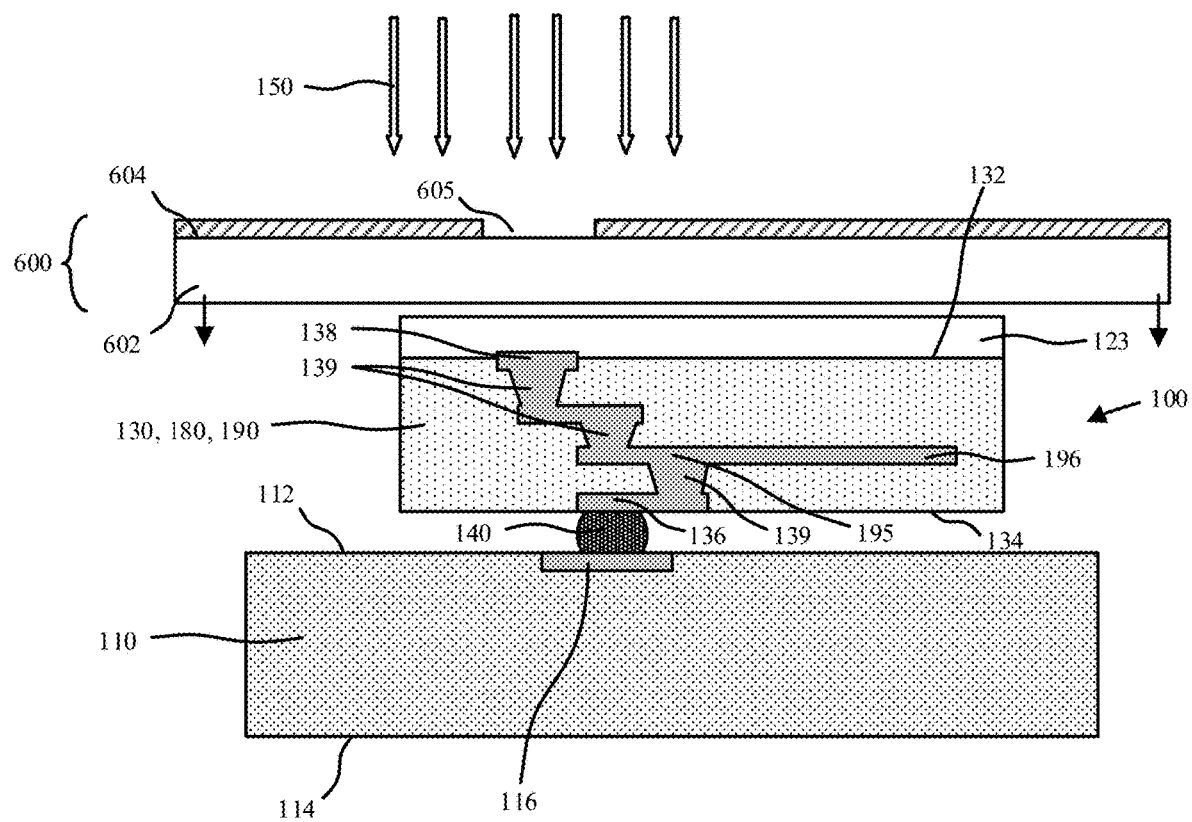
FIG. 12C a cross-sectional side view illustration of selective photonic soldering of an electronic component to a routing substrate by transferring heat through circuitry in the electronic component in accordance with an embodiment.

FIG. 12A a cross-sectional side view illustration of selective photonic soldering of an electronic component 130 (e.g. device 180 or routing substrate 190) to a routing substrate 110 by transferring heat through circuitry in the electronic component in accordance with an embodiment. The embodiment illustrated in FIG. 12A is similar to that illustrated in FIG. 11 in that a conductive path is used to transfer heat through a substrate. In the embodiment illustrated in FIG. 12A, heat is transferred through circuitry in the electronic component 130, which need not be transparent and may be transparent or opaque, and rigid or flexible. As shown, the electronic component is bonded to the routing substrate 110 with a bonding material 140 that connects landing pad 116 and metal contact pad 136. The contact pad 136 is electrically connected to an absorption pad 138 on an opposite side of the electronic component 130. In the illustrated embodiment, this corresponds to the top side 132, and the circuitry connects the top side 132 to bottom side 134 of the electronic component. The circuitry connecting the absorption pad 138 to the contact pad 136 may include one or more vias 139 and routing layers 196. A shown, a photonic soldering technique may include placing a light mask 600 over the electronic component 130 such that the light pulse 150 is selectively directed to, and absorbed by the absorption pads 138, which transfer heat through the circuitry to contact pad 136, and hence bonding material 140 to activate the bonding material. Other configurations are also possible. For example, if the electronic component 130 is transparent, the openings in the light mask 600 can also expose the contact pad(s) 136 and intermediate circuitry (vias 139, routing layers 196) such that selection portions of the circuitry are absorb the light pulse 150 and transfer heat. A coverlay film 123 may optionally be placed over the side of the electronic component (e.g. top side 132) including absorption pad(s) 138 to provide insulation and/or mechanical protection. In an embodiment, the coverlay film 123 is formed of transparent material, to facilitate transfer and absorption of the light pulse 150. In such a configuration, the absorption pad 138 is not populated with a bonding material, and thus appears open. Referring briefly to FIG. 12C an alternative embodiment of a light mask 600 is illustrated similar to that previously described and illustrated with regard to FIG. 6B. As a distinction, the patterned filter layer 604 in FIG. 12C may be patterned to include openings 605 to selectively pass the light pulse 150 to the component 130. In an embodiment, the light mask 600 can be pressed on the electronic component 130 when directing the light pulse 150 from the light source toward the absorption pad 138 on the top side 132 of the electronic component 130. For example, the light mask 600 may have an opening 605 in a patterned filter layer 604 aligned (directly) over the absorption pad 138 and between the light source and the absorption pad 138.

In some instances, the electronic component 130 may have a large metal (e.g. copper) plane formed in one of the routing layers 196. For example, such a metal plane may correspond to a ground or power plane formed in the circuitry. Referring now to the top view illustration in FIG. 12B, in order to isolate the heat path, and guide the heat down to the bonding material 140 instead of across the metal plane 199, a via pad 195 may be thermally isolated from the metal plane 199 by openings 197 partially surrounding the via pad 195 within the routing layer 196. Tie bars 198 may connect the via pad 195 to the adjacent metal plane 199 in the routing layer 196 to maintain electrical connection, while mitigating lateral heat transfer.

In an embodiment, an electronic assembly method includes directing a light pulse 150 from a light source toward an absorption pad(s) 138 on a top side 132 of an electronic component 130, and transferring thermal energy from the absorption pad 138 through circuitry located in the electronic component to the bonding material 140 to activate the bonding material. In an embodiment, an electronic assembly 100 includes an electronic component 130 including a top side 132 and a bottom side 134, where the top side 132 of the electronic component includes an absorption pad(s) 138, the bottom side 134 of the electronic component includes a contact pad(s) 136, and circuitry connects the absorption pad to the landing pad. The electronic assembly further includes a routing substrate 110 including a top side 112 and a bottom side 114, where the top side 112 of the routing substrate includes one or more metal landing pads 116. A bonding material 140 is located in a shadow of the electronic component between the electronic component 130 and the routing substrate 110. The bonding material 140 may be located on the one or more metal landing pads 116, and join the one or more metal landing pads 116 to the contact pad(s) 136. A coverlay film 123 can be located on the top side 132 of the electronic component and covering the absorption pad(s) 138. For example, the absorption pad(s) 138 may not be not populated. The circuitry that connects the absorption pad(s) 138 to the contact pad(s) 136 may optionally include a routing layer 196 that includes a via pad 195 that is electrically connected to a metal plane 199 with one or more tie bars 198 and physically separated from the metal plane 199 with one or more openings 197 around the via pad 195.

Figure 13:
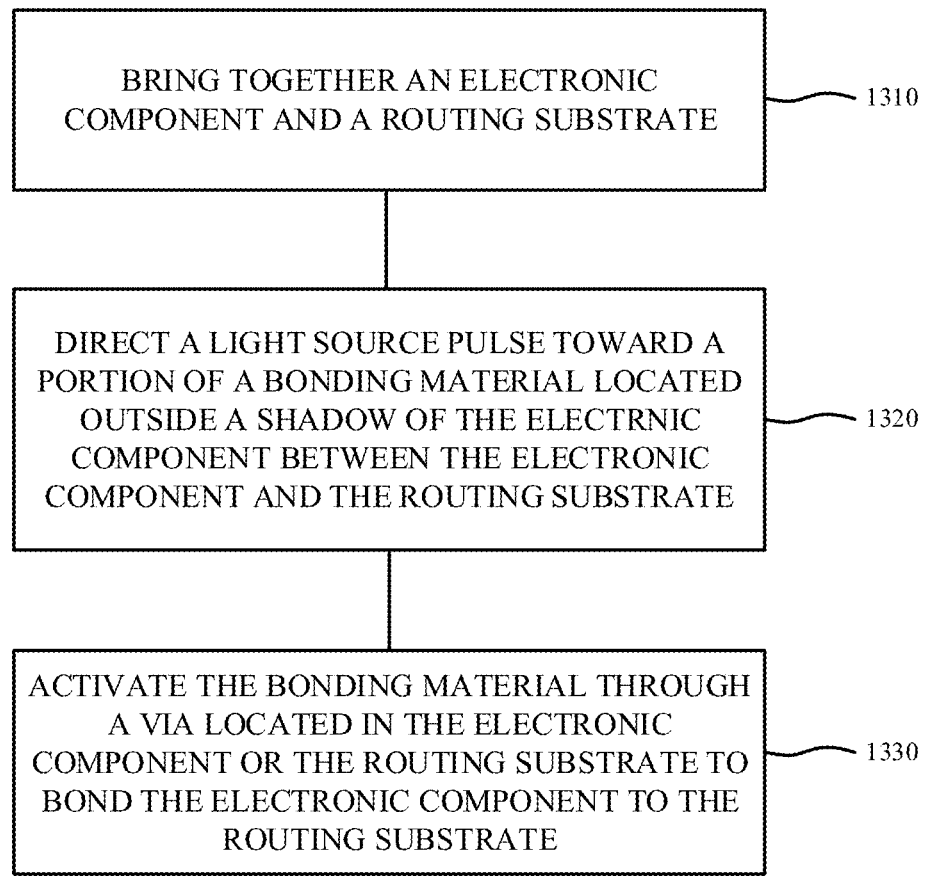
FIG. 13 is a flow chart of an electronic assembly method including selective photonic soldering through a via opening in accordance with an embodiment.

Referring now to FIG. 13 a flow chart is provided of an electronic assembly method including selective photonic soldering through a via opening in accordance with an embodiment. In interest of conciseness and clarity, the sequence of FIG. 13 is discussed concurrently with the cross-sectional side view illustrations of FIGS. 14A-15D. In an embodiment an electronic assembly method includes bringing together an electronic component and a routing substrate at operation 1310, and directing a light pulse 150 from a light source toward a portion of a bonding material 140 located outside of a shadow of the electronic component 130 between the electronic component and the routing substrate 110 at operation 1320. At operation 1330 the bonding material 140 is activated through a via opening located in the electronic component or the routing substrate to bond the electronic component to the routing substrate.

Figure 14A:
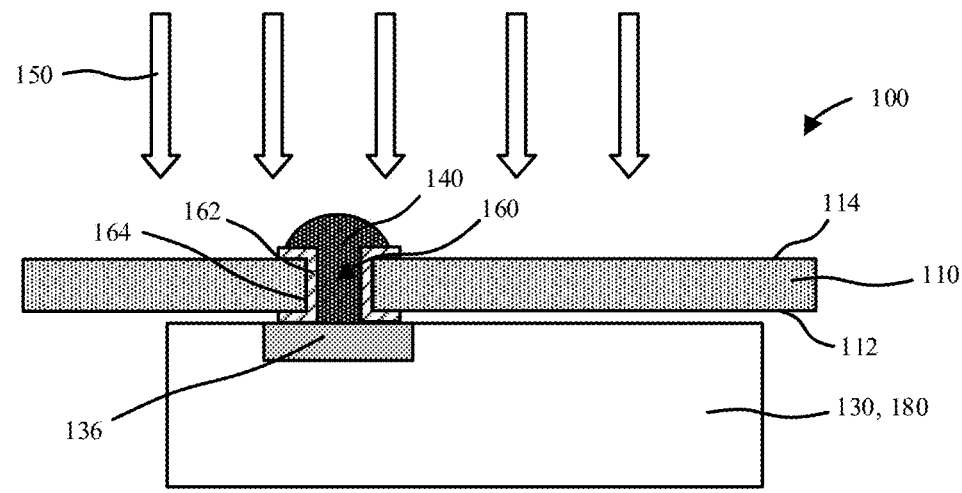
FIG. 14A is a cross-sectional side view illustration of selective photonic soldering an electronic component to a routing substrate by reflowing solder material through a via opening located in the routing substrate in accordance with an embodiment.

Referring to FIG. 14A, the via opening 160 is located in the routing substrate 110. A thermally conductive (e.g. metal) liner 162 can optionally line the via opening 160 sidewalls, and optionally the top or bottom sides of the routing substrate. The thermally conductive liner 162 can be formed using a suitable deposition technique (chemical vapor deposition, evaporation, sputtering) or laser direct structuring where a metallic inorganic compound is activated by laser. Thus, the thermally conductive liner 162 may include a metal layer of a metallic inorganic compound included in the dielectric layer(s) of the routing substrate 110.

In the illustrated embodiment, the light pulse 150 is directed toward a bottom side 114 of the routing substrate 110, and the electronic component 130 is on the top side 112 of the routing substrate 110. The routing substrate 110 may optionally be opaque the light pulse 150 to block transmission to a sensitive electronic component 130. In accordance with embodiments, the light pulse 150 activates (e.g. reflow, sintering, curing) the bonding material 140 through the via opening 160 for bonding. In a particular embodiment, this may be solder material reflow.

Figure 14D:
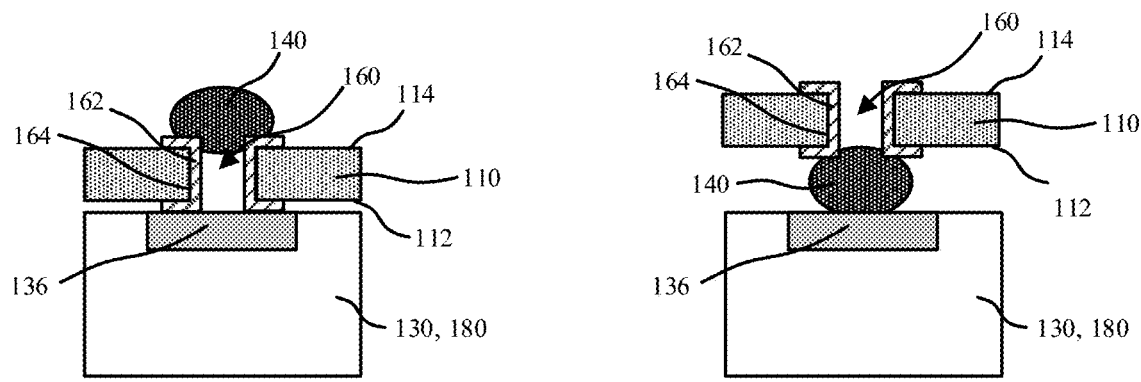
Figure 14D:
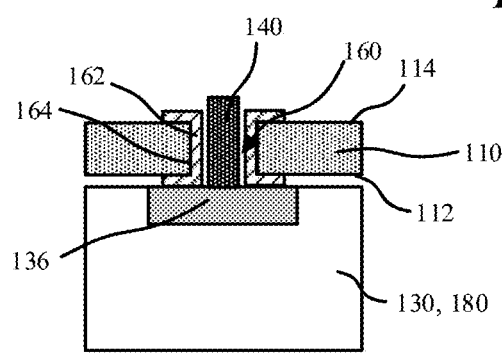

FIGS. 14B-14D are close-up cross-section side view illustration of a solder material location prior to reflow in accordance with embodiments. The bonding material 140 in accordance with embodiment may be formed of a variety of suitable materials, such as solder (e.g. low temperature or high temperature) and may be a variety of suitable shapes, including solder balls and other preforms, such as cylinders, blocks, t-shape preforms etc. In the embodiment illustrated in FIG. 14B the bonding material 140 is applied to, or "bumped" over the via opening 160 on the bottom side 114 of the routing substrate 110 opposite the component 130, 180. In the embodiment illustrated in FIG. 14C the bonding material 140 can be applied to the via opening 160 on the top side 112 of the routing substrate 110 or to the contact pad 136 of the component 130. In the embodiment illustrated in FIG. 14D the bonding material 140 can be placed inside the via opening 160, or onto the contact pad 136. In the particular embodiment illustrated, the bonding material 140 in the shape of a cylinder or block but may also have other shapes, including t-shape as illustrated in FIG. 15D.

Upon ceasing application of the light source, the bonding material 140 may solidify to form a joint in which the bonding material substantially fills the via opening 160 and is at least partially located on the bottom side 114 of the routing substrate 110.

Figure 15A:
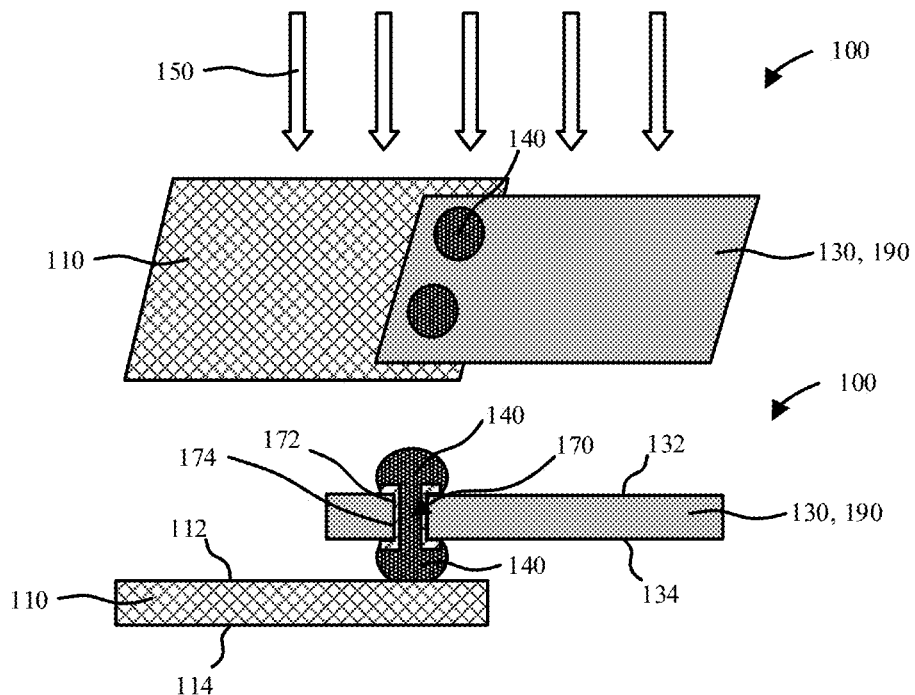
FIG. 15A is a cross-sectional side view illustration of selective photonic soldering routing substrates by reflowing solder material through a via opening located in a routing substrate in accordance with an embodiment.

A similar processing technique may be utilized for bonding of routing substrates to one another. FIG. 15A is a cross-sectional side view illustration of selective photonic soldering routing substrates by reflowing solder material through a via opening 170 located in an electronic component 130 such as a second routing substrate 190 in accordance with an embodiment. Similarly, a thermally conductive (e.g. metal) liner 172 can optionally be located on the via opening 170 sidewalls 174, and optionally the top or bottom sides 132, 134 of the second routing substrate 190. The thermally conductive liner 172 can be formed using a suitable deposition technique (chemical vapor deposition, evaporation, sputtering) or laser direct structuring where a metallic inorganic compound is activated by laser. Thus, the thermally conductive liner 172 may include a metal layer of a metallic inorganic compound included in the dielectric layer(s) of the component 130 (which may be a second routing substrate 190). As shown, the light pulse 150 is directed toward the top side 132 of the second routing substrate 190, and a bottom side 134 of the second routing substrate is bonded to the routing substrate 110. The routing substrate 110 and second routing substrate 190 may be a variety of configuration of rigid or flexible substrates, or transparent or opaque to the light pulse 150.

Figure 15B:
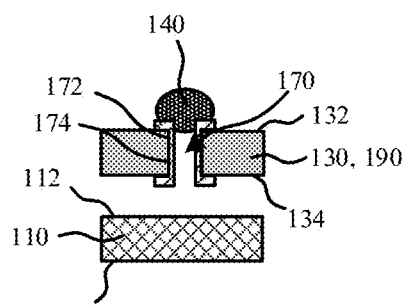
FIGS. 15B-15D are close-up cross-section side view illustration of a solder material location prior to reflow in accordance with embodiments.
Figure 15C:
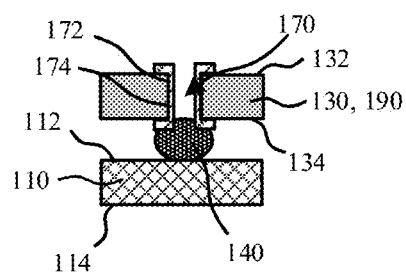
Figure 15D:
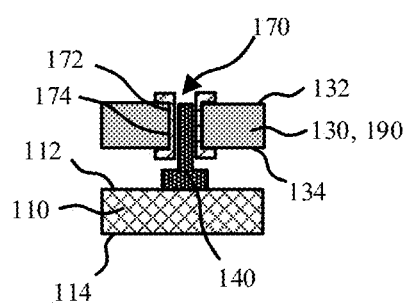

FIGS. 15B-15D are close-up cross-section side view illustration of a solder material location prior to reflow in accordance with embodiments. The bonding material 140 in accordance with embodiment may be formed of a variety of suitable materials, such as solder (e.g. low temperature or high temperature) and may be a variety of suitable shapes, including solder balls and other preforms, such as cylinders, blocks, t-shape preforms etc. In the embodiment illustrated in FIG. 15B the bonding material 140 is applied to, or "bumped" over the via opening 170 on the top side 132 of the electronic component 130 (which may be a second routing substrate 190) opposite the routing substrate 110. In the embodiment illustrated in FIG. 15C the bonding material 140 can be applied to the via opening 170 on the bottom side 134 of the component 130 (which may be a second routing substrate 190) or to the top side 112 of the routing substrate 110. In the embodiment illustrated in FIG. 15D the bonding material 140 can be placed inside the via opening 170, or onto the routing substrate 110. In the particular embodiment illustrated, the bonding material 140 is a t-shape but may also have other shapes, including cylinder, block, etc.

Upon ceasing application of the light source, the bonding material 140 may solidify to form a joint in which the bonding material substantially fills the via opening 170 and is at least partially located over the top side 132 of the second routing substrate 190 (or electronic component) and under the bottom side 134 of the second routing substrate 190 (or electronic component).

Up until this point various configurations for electronic assemblies have been described that illustrate the formation of pad-to-pad connections with bonding material joints that have been activated or reflowed by application of light energy, also referred to as photonic soldering. In particular, embodiments have described various electronic component 130 or routing substrate 190 to routing substrate 110 assemblies. For example, the electronic components 130 in accordance with all embodiments described herein may be a variety of devices 180 including chips, packages, diodes, sensors, including both active and passive devices, and routing substrates 190 such as rigid or flexible routing substrates.

Figure 16A:
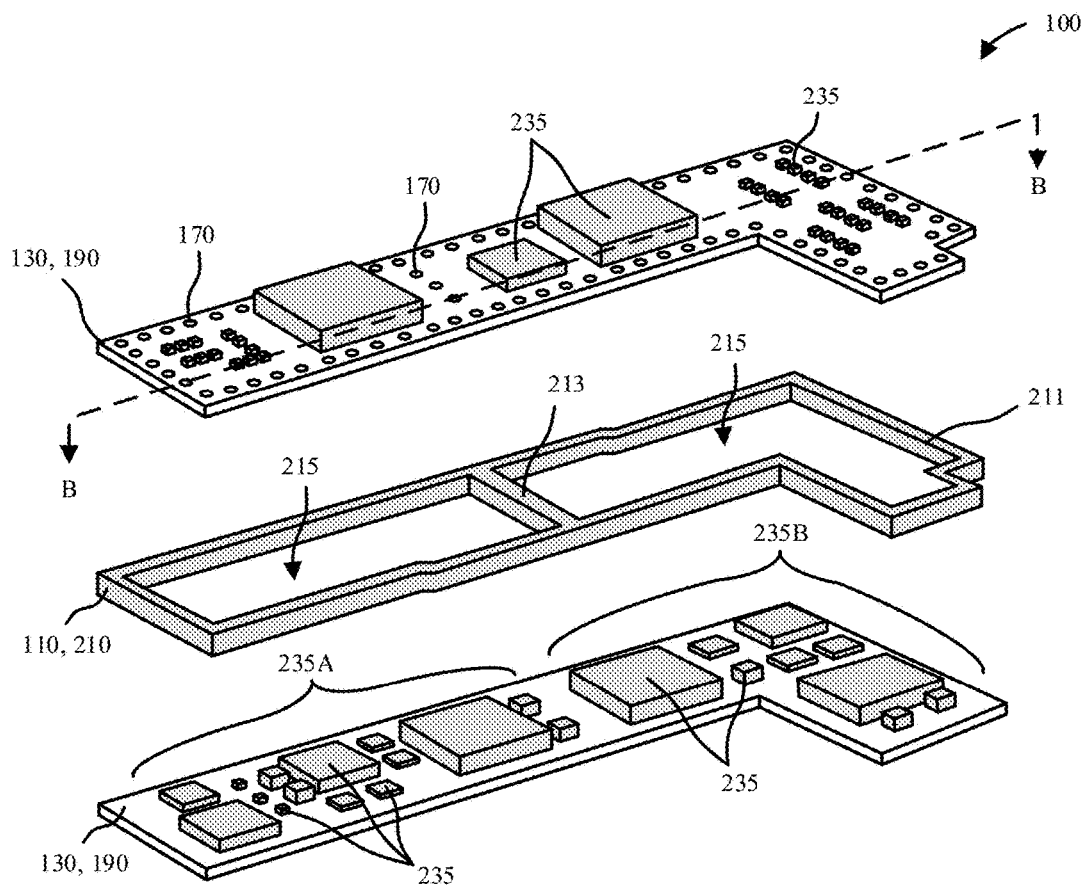
FIG. 16A is an exploded isometric view illustration of an electronic assembly in accordance with an embodiment.
Figure 16B:
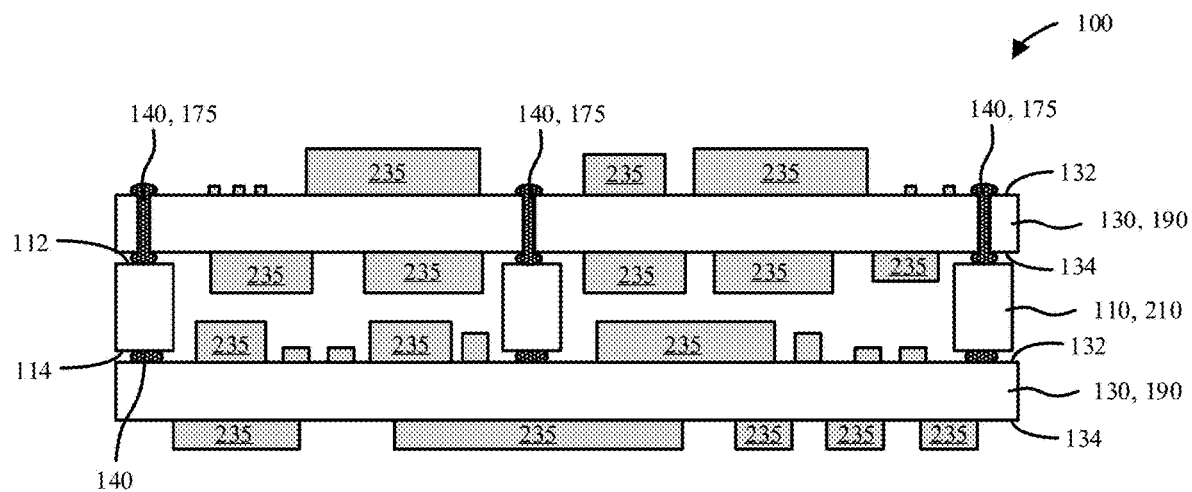
FIG. 16B is a schematic cross-sectional side view illustration taken along the line B-B of FIG. 16A in accordance with an embodiment.

Referring now to FIGS. 16A-16B a specific implementation is illustrated of an electronic assembly 100 in which an electronic component 130, and specifically a rigid circuit board, is joined to a routing substrate 110 or interposer 210 with photonic soldering. Generally, the electronic assembly 100 of FIGS. 16A-16B can include a bottom electronic component 130, a routing substrate 110 or interposer 210, and a top electronic component 130. In the particular embodiments illustrated the bottom and top electronic components 130 may be routing substrates 190 such as, but not limited to rigid circuit boards. For example, the routing substrates 190 can be circuit boards which can optionally include a plurality of devices 235 mounted on top and/or bottom sides thereof. For example, the devices 235 may be chips, packages, diodes, sensors, including both active, passive devices, and combinations thereof.

In an embodiment, the circuit board routing substrates 190 are laminates. For example, the routing substrates 190 can be a composite of woven fiberglass cloth and polymer (e.g. resin) and metal routing layers, such as FR4. The routing substrates 190 may be formed of a variety of suitable printed circuit board materials including FR4, prepreg, polyimide, etc. The routing substrates 190 may be rigid or flexible. In an embodiment, the circuit board routing substrates 190 are rigid.

The interposer 210 may optionally be formed of a similar material as the routing substrates 190, such as FR4 for example. Thus, the interposer 210 may also be considered a routing substrate 110. The interposer 210 may function to provide electrical routing between the routing substrates 190, and/or the interposer 210 may perform a primarily mechanical function. Even when performing a primarily mechanical function, such as a spacer or thermal coefficient matching, the interposer 210 may be formed of typical routing substrate material, such as FR4 board. Interposer 210 may additionally be formed of alternative materials including silicon, organics (e.g. polyimide), etc.

Referring specifically to FIG. 16A, the routing substrate 110 (or interposer 210) may be in the form of a frame including periphery walls 211 and one or more barrier walls 213 extending between two opposing periphery walls 211. The barrier wall 213 may partition separate compartment openings 215. When placed onto the bottom routing substrate 190, the barrier wall 213 may isolate a first group 235A of devices 235 from a second group 235B of devices 235. For example, the barrier wall 213 may provide electromagnetic interference (EMI) protection between the compartment openings 215. In some embodiments, the periphery walls 211 and barrier wall 213 can include electrically conductive coatings such as metal film to provide EMI protection. A plurality of devices 235 may be mounted on the top side 132 and/or bottom side 134 of the top and/or bottom routing substrates 190. As shown in FIG. 16B, the barrier walls 213 can also isolate first and second groups 235A, 235B of devices on the top routing substrate 190 when placed onto the interposer 210.

A plurality of via openings 170 can be formed completely through the top routing substrate 190, extending from the top side 132 to the bottom side 134. The via openings 170 may be along the edges or periphery of the top routing substrate 190, as well as extend between to opposite edges of the top routing substrate 190 such that the via openings 170 align with, and are directly over, the interposer 210 periphery walls 211 and barrier wall 213. In accordance with embodiments, bonding material 140 can be placed over, under, or within the via openings 170 and subjected to a high intensity flash pulse to activate, or reflow, the bonding material 140 (e.g. solder) to form bonding material joints 175 that secure the top routing substrate 190 to the interposer 210.

In one aspect, embodiments use photonics soldering (high power, short pulse of light) to reflow a bonding material 140 (e.g. solder) and attach two rigid boards (e.g. top routing substrate 190 and interposer 210) and enable the use of high temperature solder everywhere in the electronic assembly 100 with localized heating and controlled affected heat zone area(s). In a specific implementation the bottom routing substrate 190 may be a rigid wireless access point (AP) board, while the top routing substrate 190 is a rigid radio frequency (RF) board. Using a traditional mass reflow technique (global heat) could be impractical with high temperature solders due the presence of underfill under some of the devices 235 on the top and bottom routing substrates 190, where a typical high temperature reflow profile could potentially cause solder extrusion in underfill voids and shorts.

Photonic soldering with very high power and short pulse(s) of light (e.g. on the order of a few milliseconds) can heat the solder bonding material 140 to high temperatures, with peak temperatures even as high as 1,000° C., and subsequently melt the solder bonding material 140. The time spent at the elevated temperature may be only a few milliseconds so the surrounding substrate and devices may not be heated appreciably and after the pulse is over, the thermal mass of the substrate helps to rapidly cool down the temperature via conduction (hence providing localized heating of the joints only). A light mask 600 can also be used to protect the surrounding substrate and components 235 from being exposed to the light.

The bonding material joints 275 formed in accordance with embodiments using high temperature solder material can be much stronger than with low temperature solder materials, and can also be inspected with X-ray. Photonic soldering can furthermore be performed in a batch process, with multiple units at the same time and can facilitate increased throughput.

Figure 17:
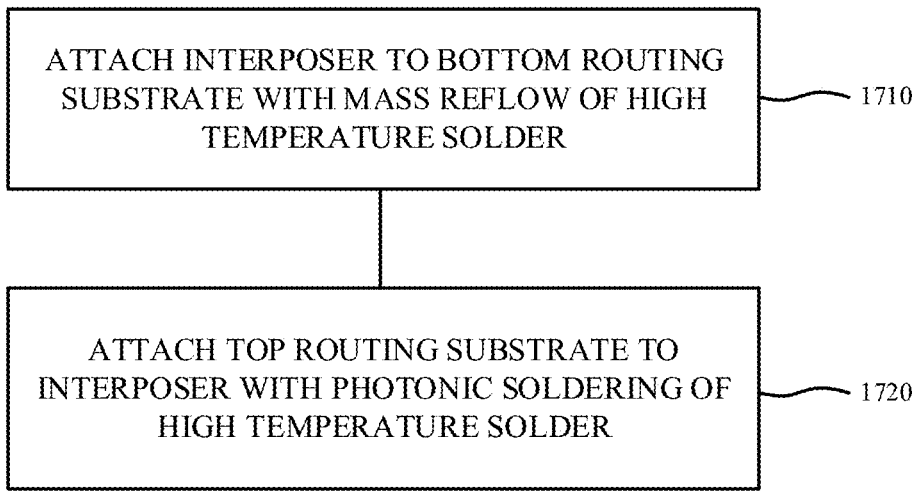
FIG. 17 is a flow chart of an electronic assembly method including mass reflow followed by photonic soldering in accordance with an embodiment.

FIG. 17 is a flow chart of an electronic assembly method including mass reflow followed by photonic soldering in accordance with an embodiment. At operation 1710 the interposer 210, or routing substrate 110, is attached to the bottom routing substrate 190, or electronic component 130, with a mass reflow technique, and using a high temperature solder bonding material 140. Thus, the mass reflow technique may include applying a global temperature, within a furnace or equivalent to achieve reflow of the bonding material 140 to join the interposer 210 to the routing substrate 190. At operation 1720 the top routing substrate 190, or electronic component 130, is then attached to the interposer 210 with photonic soldering of a high temperature solder bonding material 140.

Figure 18:
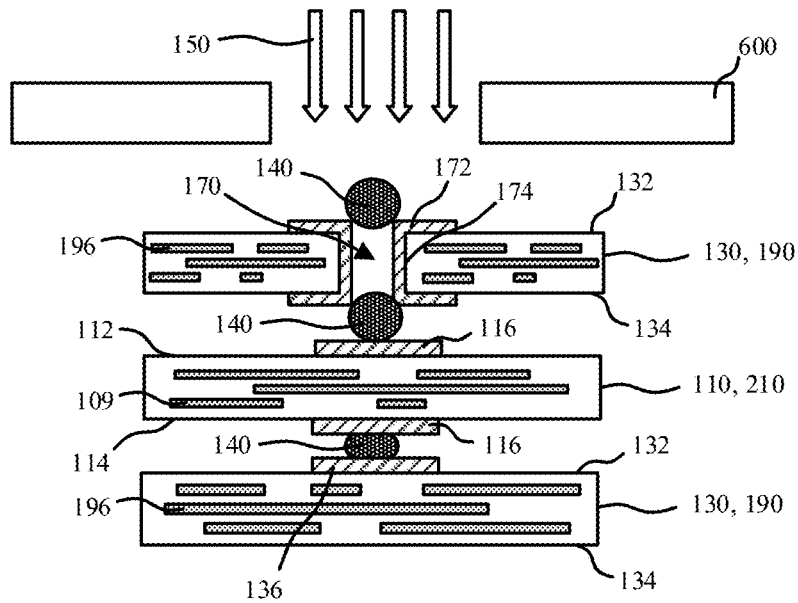
FIG. 18 is a schematic cross-sectional side view illustration of a bonding material location prior to reflow in accordance with an embodiment.

FIG. 18 is a schematic cross-sectional side view illustration of a bonding material location prior to reflow in accordance with an embodiment. As shown, the interposer 210 may have been previously joined to the bottom routing substrate 190 with mass reflow of bonding material 140 (e.g. high temperature solder material). The top side 112 of the interposer 210 may then be pre-bumped with bonding material 140 (e.g. high temperature solder balls or paste). The top routing substrate 190 can then be placed into a fixture and positioned with via openings 170 directly over the pre-bumped bonding material 140 on the interposer 210. Additional bonding material 140 (e.g. high temperature solder balls or paste) can then be placed onto the top side 132 of the top routing substrate 190, followed by the pulsed light application. In this configuration, the top bonding material 140 absorbs the light from the pulsed light, liquifies and flows down the via opening 170 to then liquify the pre-bumped bonding material 140 between the interposer 210 and the top routing substrate 190 forming the bonding material joint 175. In the particular configuration illustrated in FIG. 18, this may accommodate a thick top routing substrate 190, where it could be potentially difficult for enough of the pulsed light to travel down the via opening 170 to liquefy a bottom bonding material 140 and form the bonding material joint 175. It is to be appreciated that embodiments are not limited to such a configuration of bonding material 140 locations, and that embodiments envision variations thereof including bonding materials 140 applied to only over or under the top routing substrate 190, or within the via opening 170, including the configurations of FIGS. 15A-15D.

Figures 19A, 19B:
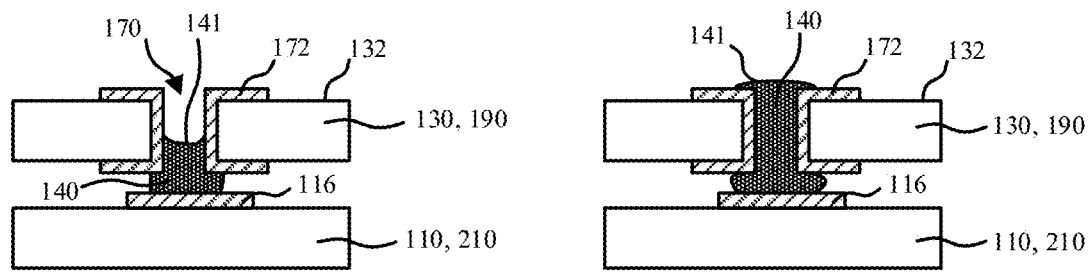
FIG. 19A is a schematic cross-sectional side view illustration of a bonding material joint partially filling a via opening in accordance with an embodiment.
FIG. 19B is a schematic cross-sectional side view illustration of a bonding material joint completely filling a via opening in accordance with an embodiment.

In accordance with embodiments, at least a portion of the via openings 170 may be filled with the reflowed bonding material joints 175. The bonding material joints 175 may partially fill the via openings 170 as illustrated in FIG. 19A, or may completely fill the via openings 170 as illustrated in FIG. 19B. The volume of the bonding material joints 175 filling the via openings 170 can be controlled to achieve specified adhesion between the substrates, or for rework. For example, partially filed via openings 170 may be potentially be more easily reworked, should the substrates need to be moved, or separated to fix an internally mounted device 235, for example.

Referring briefly again to FIGS. 15A-15B, in an embodiment an electronic assembly 100 includes a routing substrate 110 including a top side 112 and a bottom side 114, an electronic component 130 including a plurality of via openings 170 between a top side 132 and a bottom side 134 of the electronic component, and a corresponding plurality of separate bonding material 140 joints, where each bonding material joint is on the top side 112 of the routing substrate 110 and at least partially fills a corresponding via opening 170 of the plurality of via openings 170. The routing substrate 110 may further include a plurality of metal landing pads 116 on the top side 112 of the routing substrate, and each bonding material joint 175 is bonded to a corresponding metal landing pad 116. A corresponding thermally conductive liner 172 may also be located along sidewalls of each via opening 170 in the electronic component 130, and may also partially span the top side 132 and bottom side 134 of the electronic component 130.

The electronic component 130 may be a second (top) routing substrate 190. For example, both the routing substrate 110 and top routing substrate 190 may be rigid routing substrates such as, but not limited to, FR4 boards. For example, rigid routing substrate 110 can include a plurality of conductive routing layers 109, while the top rigid routing substrate 190 includes a plurality of routing layers 196. In an embodiment, the electronic component 130 is a top rigid circuit board.

Referring now to FIGS. 16-16B, in a specific implementation the routing substrate 110 is an interposer 210, and a bottom side of the interposer 210 is bonded to a bottom rigid circuit board 190 (also an electronic component 130). As described, the interposer 210 can be bonded to the bottom rigid circuit board 190 with a bottom high temperature solder material 140 characterized by a liquidus temperature of above 217° C. Each bonding material joint 175 can also formed of a top high temperature solder material 140 characterized by a liquidus temperature of above 217° C. In an embodiment, a majority of the bonding material joints 175 include a top meniscus 141 inside a corresponding via opening 170 (as shown in FIG. 19A) such that the majority of the bonding material joints 175 do not completely fill the corresponding via openings 170. In an embodiment, a majority of the bonding material joints 175 completely fill the corresponding via openings 170 (as shown in FIG. 19B).

The interposer 210 may be laminate substrate, such as FR4, including a plurality of conductive routing layers 109. In an embodiment, a first plurality of devices 235 is bonded to the top side of the bottom rigid circuit board 190. Additionally, a second plurality of devices 235 can be bonded to the bottom side of the top rigid circuit board 190.

In an embodiment, an electronic assembly 100 includes a bottom rigid circuit board, a first plurality of devices 235 bonded to a top side 132 of the bottom rigid circuit board, an interposer 210 bonded to the bottom rigid circuit board laterally adjacent to the first plurality of devices 235, and a top rigid circuit board bonded to the interposer with a plurality of bonding material joints 175, where the top rigid circuit board includes a plurality of via openings 170 extending completely through the top rigid circuit board, and the plurality of bonding material joints 175 at least partially fill the corresponding plurality of via openings 170. The interposer 210 may further include a first compartment opening 215 and a second compartment opening 215 separated by a barrier wall 213, where a first group 235A of the first plurality of devices is partitioned from a second group 235B of the first plurality of devices by the barrier wall 213. In an embodiment, a portion of the via openings 170 is located directly over the barrier wall 213. In an embodiment, the interposer 210 is bonded to the bottom rigid circuit board with a first high temperature solder material 140 characterized by a liquidus temperature of above 217° C., and each bonding material joint 175 is characterized by a liquidus temperature of above 217° C.

In utilizing the various aspects of the embodiments, it would become apparent to one skilled in the art that combinations or variations of the above embodiments are possible for selective photonic soldering. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An electronic assembly comprising:
a routing substrate including a top side and a bottom side, wherein the routing substrate includes a first compartment opening and a second compartment opening separated by a barrier wall;
an electronic component including a plurality of via openings between a top side and a bottom side of the electronic component;
a corresponding plurality of separate bonding material joints, wherein each bonding material joint is on the top side of the routing substrate and at least partially fills a corresponding via opening of the plurality of via openings; and
a plurality of devices bonded to a bottom side of the electronic component, wherein a first group of the plurality of devices is partitioned from a second group of the plurality of devices by the barrier wall.

2. The electronic assembly of claim 1, wherein the routing substrate further comprises a plurality of metal landing pads on the top side of the routing substrate, and each bonding material joint is bonded to a corresponding metal landing pad.

3. The electronic assembly of claim 1, further comprising a corresponding thermally conductive liner along sidewalls of each via opening in the electronic component.

4. The electronic assembly of claim 1, wherein the electronic component is a second routing substrate.

5. The electronic assembly of claim 4, wherein the routing substrate is a rigid routing substrate, and the second routing substrate is a second rigid routing substrate.

6. The electronic assembly of claim 5, wherein the rigid routing substrate includes a plurality of conductive routing layers.

7. The electronic assembly of claim 6, wherein the second rigid routing substrate includes a plurality of routing layers.

8. The electronic assembly of claim 1, wherein the electronic component is a top rigid circuit board.

9. The electronic assembly of claim 8, wherein the routing substrate is an interposer, wherein the bottom side of the interposer is bonded to a bottom rigid circuit board.

10. The electronic assembly of claim 9, wherein the interposer is bonded to the bottom rigid circuit board with a bottom high temperature solder material characterized by a liquidus temperature of above 217° C.

11. The electronic assembly of claim 10, wherein each bonding material joint is formed of a top high temperature solder material characterized by a liquidus temperature of above 217° C.

12. The electronic assembly of claim 9, wherein a majority of the bonding material joints include a top meniscus inside a corresponding via opening, such that the majority of the bonding material joints do not completely fill the corresponding via openings.

13. The electronic assembly of claim 9, wherein a majority of the bonding material joints completely fill the corresponding via openings.

14. The electronic assembly of claim 9, wherein the interposer is a laminate substrate including a plurality of conductive routing layers.

15. The electronic assembly of claim 9, further comprising a second plurality of devices bonded to a top side of the bottom rigid circuit board.

16. The electronic assembly of claim 15, wherein a first group of the second plurality of devices is partitioned from a second group of the second plurality of devices by the barrier wall.

17. An electronic assembly comprising:
a bottom rigid circuit board;
a first plurality of devices bonded to a top side of the bottom rigid circuit board;
an interposer bonded to the bottom rigid circuit board laterally adjacent to the first plurality of devices;
wherein the interposer includes a first compartment opening and a second compartment opening separated by a barrier wall, wherein a first group of the first plurality of devices is partitioned from a second group of the first plurality of devices by the barrier wall;

a top rigid circuit board bonded to the interposer with a plurality of bonding material joints, wherein the top rigid circuit board includes a plurality of via openings extending completely through the top rigid circuit board, and the plurality of bonding material joints at least partially fill the plurality of via openings.

18. The electronic assembly of claim 17, further comprising a second plurality of devices bonded to a bottom side of the top rigid circuit board, wherein a first group of the second plurality of devices is partitioned from a second group of the second plurality of devices by the barrier wall.

19. The electronic assembly of claim 17, wherein a portion of the via openings is located directly over the barrier wall.

20. The electronic assembly of claim 17, wherein the interposer is bonded to the bottom rigid circuit board with a first high temperature solder material characterized by a liquidus temperature of above 217° C., and each bonding material joint is characterized by a liquidus temperature of above 217° C.

* * * * *